US012711363B2

(12) United States Patent
Bidkar et al.

(10) Patent No.: US 12,711,363 B2
(45) Date of Patent: Aug. 18, 2026

(54) SYSTEM FOR DYNAMIC AUTHENTICATION AND PROCESSING OF ELECTRONIC ACTIVITIES BASED ON PARALLEL NEURAL NETWORK PROCESSING

(71) Applicant: BANK OF AMERICA CORPORATION, Charlotte, NC (US)

(72) Inventors: Prashant Anna Bidkar, Shakarpur (IN); Meenakshi Gupta, Rohini (IN); Prashant Khare, Mumbai (IN); Kanika Manocha, New Delhi (IN); Ankit Upadhyaya, Gurugram (IN)

(73) Assignee: BANK OF AMERICA CORPORATION, Charlotte, NC (US)

( * ) Notice: Subject to any disclaimer, the term of this patent is extended or adjusted under 35 U.S.C. 154(b) by 1240 days.

(21) Appl. No.: 17/494,532

(22) Filed: Oct. 5, 2021

(65) Prior Publication Data

US 2023/0107541 A1 Apr. 6, 2023

(51) Int. Cl.
*G06N 3/063* (2023.01)
*G06F 9/48* (2006.01)
(Continued)

(52) U.S. Cl.
CPC ........... *G06N 3/063* (2013.01); *G06F 9/4881* (2013.01); *G06F 9/526* (2013.01); *G06N 3/04* (2013.01);
(Continued)

(58) Field of Classification Search
CPC . G06N 3/063; G06N 3/04; G06N 3/08; G06F 9/4881; G06F 9/526; G11C 11/54; H04L 43/02; H04L 43/04
See application file for complete search history.

(56) References Cited

U.S. PATENT DOCUMENTS 5,140,530 A 8/1992 Guha et al.
5,249,259 A 9/1993 Harvey
(Continued)

FOREIGN PATENT DOCUMENTS

CA 2923600 A1 9/2016
CN 104035751 B 10/2016
(Continued)

OTHER PUBLICATIONS

Md Shad Akhtar et al., "Multi-task Learning for Multi-modal Emotion Recognition and Sentiment Analysis", May 14, 2019, arXiv (Year: 2019).*
(Continued)

*Primary Examiner* — Li B. Zhen
*Assistant Examiner* — Jessica T Pham
(74) *Attorney, Agent, or Firm* — Moore & Van Allen PLLC; Vaidehi Bachoti

(57) ABSTRACT

Embodiments of the invention are directed to a system, method, or computer program product for dynamic authentication and processing of electronic activities based on parallel neural network processing. The invention provides a novel method for processing, in parallel, the activity data via a neuron cluster component, constructing an authentication level parameter associated with the parameter outputs for the first activity, and process the first activity based on at least determining that the authentication level parameter associated with the first activity is above a predetermined authentication threshold. In this regard, the invention is structured for neuron cluster bandwidth availability based input mapping and process channeling for dynamic detection of security events associated with network devices and resources and triggering real-time mitigation operations.

20 Claims, 6 Drawing Sheets

(51) Int. Cl.

| | |
|---|---|
| ***G06F 9/52*** | (2006.01) |
| ***G06N 3/04*** | (2023.01) |
| ***G06N 3/08*** | (2023.01) |
| ***G11C 11/54*** | (2006.01) |
| ***H04L 43/02*** | (2022.01) |
| ***H04L 43/04*** | (2022.01) |

(52) U.S. Cl.

CPC ................ *G06N 3/08* (2013.01); *G11C 11/54* (2013.01); *H04L 43/02* (2013.01); *H04L 43/04* (2013.01)

(56) References Cited

U.S. PATENT DOCUMENTS

| | | | |
|---|---|---|---|
| 5,487,153 | A | 1/1996 | Hammerstrom et al. |
| 5,644,749 | A | 7/1997 | Obayashi |
| 6,654,730 | B1 | 11/2003 | Kato et al. |
| 6,836,767 | B2 | 12/2004 | Mcbride |
| 7,444,637 | B2 | 10/2008 | Pronovost et al. |
| 7,526,634 | B1 | 4/2009 | Duluk, Jr. et al. |
| 7,539,608 | B1 | 5/2009 | Dageville et al. |
| 8,069,446 | B2 | 11/2011 | Zhao et al. |
| 9,477,925 | B2 | 10/2016 | Seide et al. |
| 9,747,546 | B2 | 8/2017 | Ross et al. |
| 9,851,771 | B2 | 12/2017 | Cooper et al. |
| 10,650,824 | B1 * | 5/2020 | Kesharaju ............... G10L 17/00 |
| 2004/0133531 | A1 | 7/2004 | Chen et al. |
| 2004/0257240 | A1 | 12/2004 | Chen et al. |
| 2005/0071168 | A1 * | 3/2005 | Juang ...................... G10L 17/24 704/E17.011 |
| 2007/0011114 | A1 | 1/2007 | Chen et al. |
| 2009/0179894 | A1 | 7/2009 | Bakalash et al. |
| 2009/0182693 | A1 | 7/2009 | Fulton et al. |
| 2010/0257538 | A1 | 10/2010 | Zhao et al. |
| 2016/0321777 | A1 | 11/2016 | Jin et al. |
| 2016/0335119 | A1 | 11/2016 | Merrill et al. |
| 2016/0364644 | A1 | 12/2016 | Brothers et al. |
| 2017/0011288 | A1 | 1/2017 | Brothers et al. |
| 2017/0148433 | A1 | 5/2017 | Catanzaro et al. |
| 2018/0032911 | A1 | 2/2018 | Yamazaki et al. |
| 2018/0053091 | A1 | 2/2018 | Savvides et al. |
| 2018/0121786 | A1 | 5/2018 | Narayanaswami et al. |
| 2018/0300615 | A1 | 10/2018 | Ambardekar et al. |
| 2018/0300616 | A1 * | 10/2018 | Ambardekar ....... G06F 15/8007 |
| 2020/0210815 | A1 | 7/2020 | Zhang |
| 2021/0157945 | A1 * | 5/2021 | Cobb ...................... G06F 21/32 |
| 2021/0160687 | A1 * | 5/2021 | Ross ........................ G06N 3/09 |

FOREIGN PATENT DOCUMENTS

| | | | |
|---|---|---|---|
| GB | 2382899 | B | 12/2003 |
| WO | 2015192812 | A1 | 12/2015 |

OTHER PUBLICATIONS

Lukasz Kaiser et al., “One Model to Learn Them All”, Jun. 16, 2017, arXiv (Year: 2017).*

Yechang Xiang, “Pipelined Data-Parallel CPU/GPU Scheduling for Multi-DNN Real-Time Inference”, 2019, IEEE Real-Time Systems Symposium (RTSS), pp. 392-405 (Year: 2019).*

* cited by examiner

PERFORM TASK-BASED INPUT MAPPING OF THE PLURALITY OF INPUT PARAMETERS ASSOCIATED WITH THE FIRST ACTIVITY
502

TRIGGER A FIRST NEURON CLUSTER OF THE PLURALITY OF NEURON CLUSTERS FOR PROCESSING A FIRST INPUT PARAMETER OF THE PLURALITY OF INPUT PARAMETERS, IN RESPONSE TO DETERMINING THAT (i) THE BANDWIDTH AVAILABILITY OF THE FIRST NEURON CLUSTER IS ABOVE A PREDETERMINED THRESHOLD AND (ii) THE FIRST NEURON CLUSTER MATCHES THE TASK-BASED INPUT MAPPING ASSOCIATED WITH THE FIRST INPUT PARAMETER
504

PERFORM, VIA THE FIRST NEURON CLUSTER, A FIRST PROCESSING FUNCTION ON THE FIRST INPUT PARAMETER OF THE PLURALITY OF INPUT PARAMETERS, IN PARALLEL WITH PERFORMING A SECOND PROCESSING FUNCTION ON A SECOND INPUT PARAMETER OF THE PLURALITY OF INPUT PARAMETERS VIA A SECOND NEURON CLUSTER OF THE PLURALITY OF NEURON CLUSTERS
506

TRIGGER A THIRD NEURON CLUSTER OF THE PLURALITY OF NEURON CLUSTERS FOR PERFORMING A THIRD PROCESSING FUNCTION ON THE FIRST INPUT PARAMETER
508

LINK, VIA A SYNCHRONOUS RECALL UNIT, PARAMETER OUTPUTS OF THE PLURALITY OF PROCESSING OUTPUTS ASSOCIATED WITH THE FIRST ACTIVITY FROM THE NEURON CLUSTER COMPONENT
510

CONSTRUCT AN AUTHENTICATION LEVEL PARAMETER ASSOCIATED WITH THE PARAMETER OUTPUTS FOR THE FIRST ACTIVITY
512

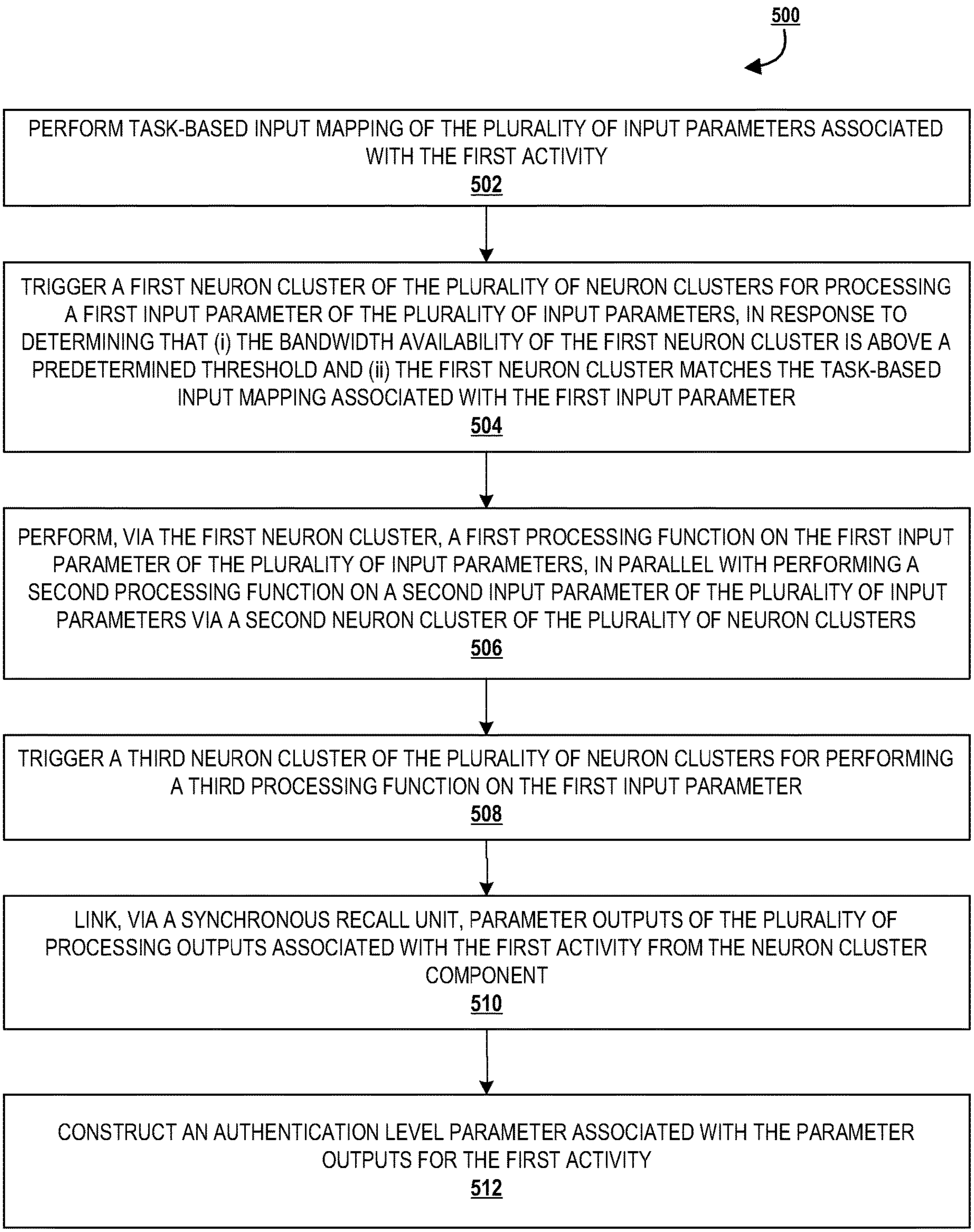

*FIG. 5*

SYSTEM FOR DYNAMIC AUTHENTICATION AND PROCESSING OF ELECTRONIC ACTIVITIES BASED ON PARALLEL NEURAL NETWORK PROCESSING

FIELD OF THE INVENTION

The present invention is directed to dynamic authentication of electronic activities. Furthermore, the present invention embraces a novel, proactive approach for processing activity data to validate processing of activities in a simultaneous, parallel manner.

BACKGROUND

Over the last few years, there has been a significant increase in the number of electronic activities, due to widespread use of smartphone, tablet computers, laptop computers, transaction terminals, and electronic computing devices in general which are configured for accepting authentication credentials in electronic form. Identifying and ensuring the accuracy and security of electronic activities is crucial. Typically, in conventional systems, one or more activities may be initiated using a network device, with the activities seeking to access, modify, transfer, and/or otherwise operate upon secure data and resources associated with a user. However, conventional systems typically process these activities merely based on mere authentication credentials. Moreover, because only a set of one or more credentials, which typically do not change for one user activity to another, are required to be validated for performing the user activity at a point in time, the veracity of the source/provider of credentials cannot be ascertained in conventional systems. Conventional systems typically cannot detect whether the activity data is accurate and whether the activities are being initiated by an unauthorized entity/individual in the first place in real-time, and hence undesirably may let the inaccurate/unauthorized activity proceed. Conventional systems typically may only be able to detect that the activity is associated with inaccurate data or that the activity is unauthorized after the activity is processed, rendering them unable to prevent inaccurate processing in real time and unable to prevent exposure of secure data in real time.

Accordingly, there is a need for a network security system that solves the foregoing problems in conventional technology and provides real-time detection of inaccuracies and real-time prevention of unauthorized activities, in an adaptive proactive manner. The previous discussion of the background to the invention is provided for illustrative purposes only and is not an acknowledgement or admission that any of the material referred to is or was part of the common general knowledge at the priority date of the application.

SUMMARY

In one aspect, the present invention is directed to in general dynamic authentication and processing of electronic activities based on parallel neural network processing, a corresponding system, method, and computer program product. The system is structured for neuron cluster bandwidth availability based input mapping and process channeling for dynamic detection of security events associated with network devices and resources and triggering real-time mitigation operations. The system typically includes at least one processing device operatively coupled to at least one memory device and at least one communication device connected to a distributed network. The system also typically includes a module stored in the at least one memory device comprising executable instructions that when executed cause the processing device and hence the system to perform one or more functions described below. In one embodiment, the system is configured to: receive, from a first network device, a request to execute a first activity via a first activity channel, wherein the first activity is associated with a first resource; extract activity data regarding the first network device and the first resource, wherein extracting the activity data comprises: capturing, via one or more sensor devices, a plurality of input parameters associated with the first activity; process, in parallel, the activity data via a neuron cluster component, wherein the neuron cluster component comprises a plurality of neuron clusters associated with a plurality of neuron layers, wherein processing, in parallel, the activity data comprises: performing task-based input mapping of the plurality of input parameters associated with the first activity; determining bandwidth availability of the plurality of neuron clusters of the neuron cluster component; triggering a first neuron cluster of the plurality of neuron clusters for processing a first input parameter of the plurality of input parameters, in response to determining that (i) the bandwidth availability of the first neuron cluster is above a predetermined threshold and (ii) the first neuron cluster matches the task-based input mapping associated with the first input parameter, wherein the first neuron cluster is associated with a first neuron layer; and performing, via the first neuron cluster, a first processing function on the first input parameter of the plurality of input parameters, in parallel with performing a second processing function on a second input parameter of the plurality of input parameters via a second neuron cluster of the plurality of neuron clusters; link, via a synchronous recall unit, parameter outputs of the plurality of processing outputs associated with the first activity from the neuron cluster component; construct an authentication level parameter associated with the parameter outputs for the first activity; and process the first activity based on at least determining that the authentication level parameter associated with the first activity is above a predetermined authentication threshold.

In another embodiment, and in combination with the previous embodiment, performing task-based input mapping of the plurality of input parameters associated with the first activity further comprises: analyzing data associated with the plurality of input parameters; determining, for each input parameter of the plurality of input parameters, an associated processing task type; and mapping each input parameter of the plurality of input parameters to the associated processing task type.

In another embodiment, and in combination with the previous embodiment, processing, in parallel, the activity data comprises further comprises: trigger the second neuron cluster of the plurality of neuron clusters for processing the second input parameter of the plurality of input parameters, in response to determining that (i) the bandwidth availability of the second neuron cluster is above a predetermined threshold and (ii) the second neuron cluster matches the task-based input mapping associated with the second input parameter, wherein the second neuron cluster is associated with a first neuron layer.

In another embodiment, and in combination with the previous embodiment, processing, in parallel, the activity data comprises further comprises: in response to the first processing function on the first input parameter of the plurality of input parameters via the first neuron cluster, trigger a third neuron cluster of the plurality of neuron clusters for performing a third processing function on the first input parameter of the plurality of input parameters based on at least determining that the bandwidth availability of the third neuron cluster is above the predetermined threshold, wherein the third neuron cluster is associated with a second neuron layer that is downstream from the first neuron layer associated with the first neuron cluster.

In another embodiment, and in combination with the previous embodiment, during triggering of the first neuron cluster of the plurality of neuron clusters for processing the first input parameter of the plurality of input parameters, (i) the third neuron cluster of the plurality of neuron clusters is associated with performing the third processing function on a fourth input parameter associated with a second activity associated with a second resource, and (ii) the bandwidth availability of the third neuron cluster is not above the predetermined threshold.

In another embodiment, and in combination with the previous embodiment, linking, via the synchronous recall unit, parameter outputs of the plurality of processing outputs further comprises: detecting a plurality of processing outputs from the neuron cluster component; determining the parameter outputs of the plurality of processing outputs associated with the plurality of input parameters of the first activity; tagging each of the parameter outputs of the plurality of processing outputs with an identifier associated with the first activity.

In another embodiment, and in combination with the previous embodiment, the plurality of input parameters associated with the first activity comprise an audio capture file. Here, the invention is further configured to: transform audio data of the audio capture file into a textual format; analyze, via a declarative mapping component, the transformed audio capture file into the textual format to determine activity performance parameters associated with the first activity; and construct a data matching parameter associated with the activity performance parameters; and wherein processing the first activity is based on (i) determining that the authentication level parameter associated with the first activity is above the predetermined authentication threshold, and (ii) determining that the data matching parameter is above a predetermined evaluation threshold.

In another embodiment, and in combination with the previous embodiment, the plurality of input parameters associated with the first activity comprise a location parameter, a voice state parameter, an audio capture file, and a time parameter.

In another embodiment, and in combination with the previous embodiment, the request to execute the first activity via the first activity channel is associated with an audio communication channel. Here, the plurality of input parameters associated with the first activity comprise a location parameter, a voice state parameter, an audio capture file, and a time parameter.

In another embodiment, and in combination with the previous embodiment, the request to execute the first activity via the first activity channel is associated with a non-audio communication channel. Here, the plurality of input parameters associated with the first activity comprise a location parameter, an internet protocol (IP) parameter, and a time parameter.

In another embodiment, and in combination with the previous embodiment, the plurality of neuron layers comprises one or more input layers, one or more hidden layers and one or more output layers.

In another embodiment, and in combination with the previous embodiment, the invention is further configured to: trigger, in real-time, initiation of the one or more tiered adaptive mitigation actions, prior processing of the first activity via the first activity channel to prevent security exposure associated with the first activity, in response to determining that the authentication level parameter associated with the first activity is not above the predetermined authentication threshold; block processing of the first activity via the first activity channel; and in response to determining a security proceed signal, process the first activity via the first activity channel.

In another embodiment, and in combination with the previous embodiment, initiating the one or more tiered adaptive mitigation actions further comprises: implementing a partial block of the first resource such that the first activity associated with the first resource is blocked; determining one or more second resources associated with the first resource; and implementing a block on the one or more second resources such that execution of one or more second activities associated with the one or more second resources is prevented.

The features, functions, and advantages that have been discussed may be achieved independently in various embodiments of the present invention or may be combined with yet other embodiments, further details of which can be seen with reference to the following description and drawings.

BRIEF DESCRIPTION OF THE DRAWINGS

Figure 1:
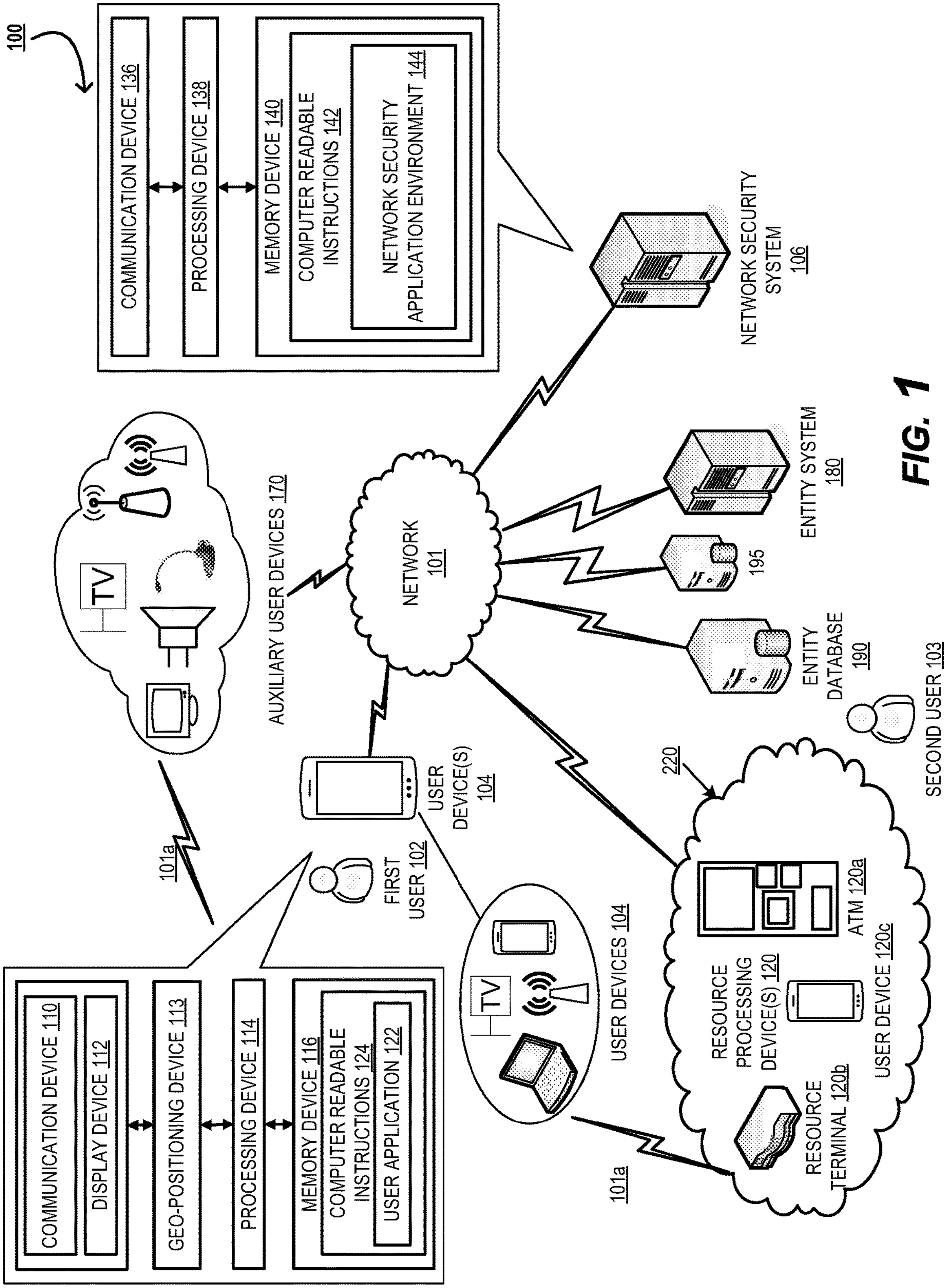
Figure 2:
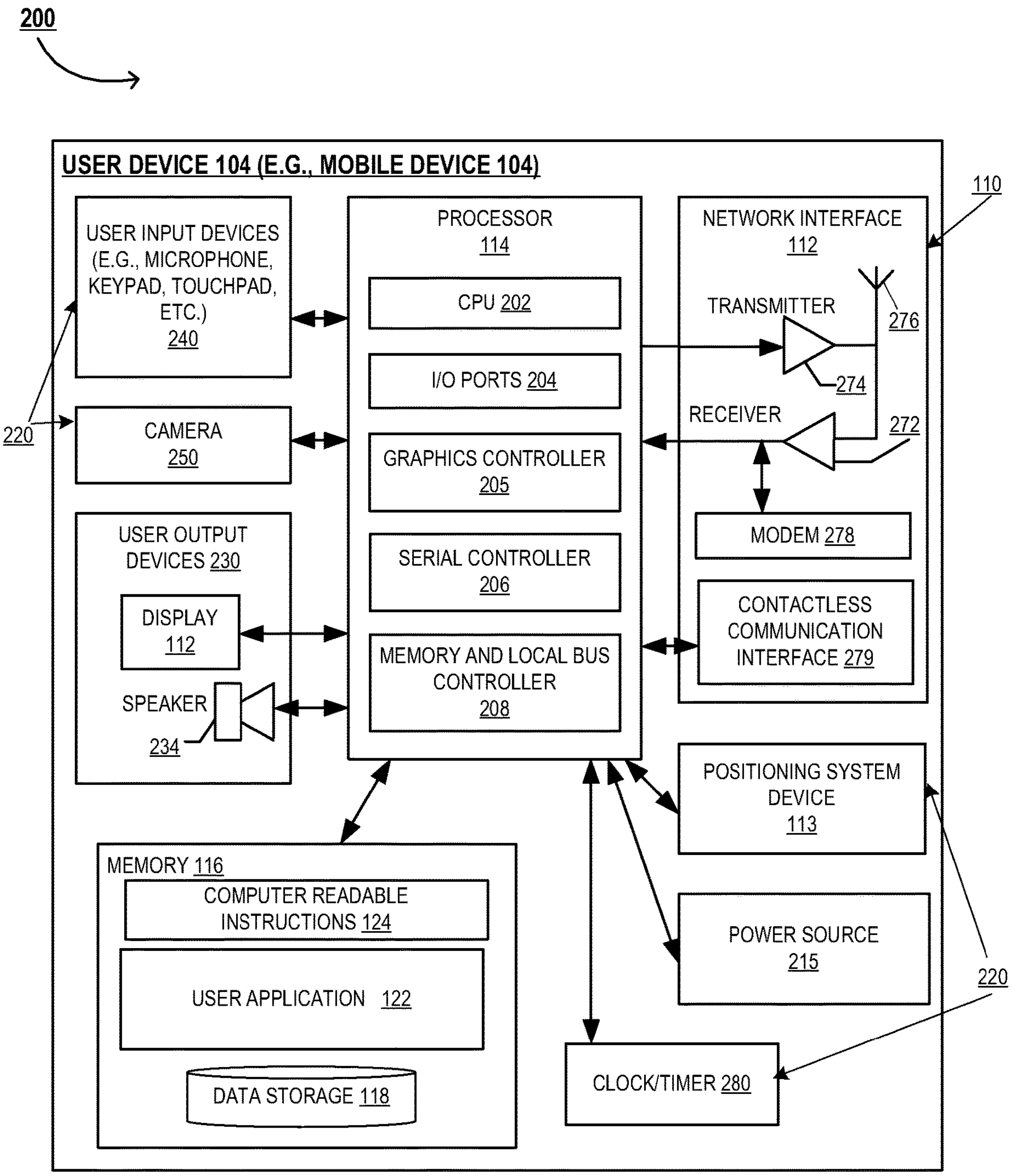
Figure 3:
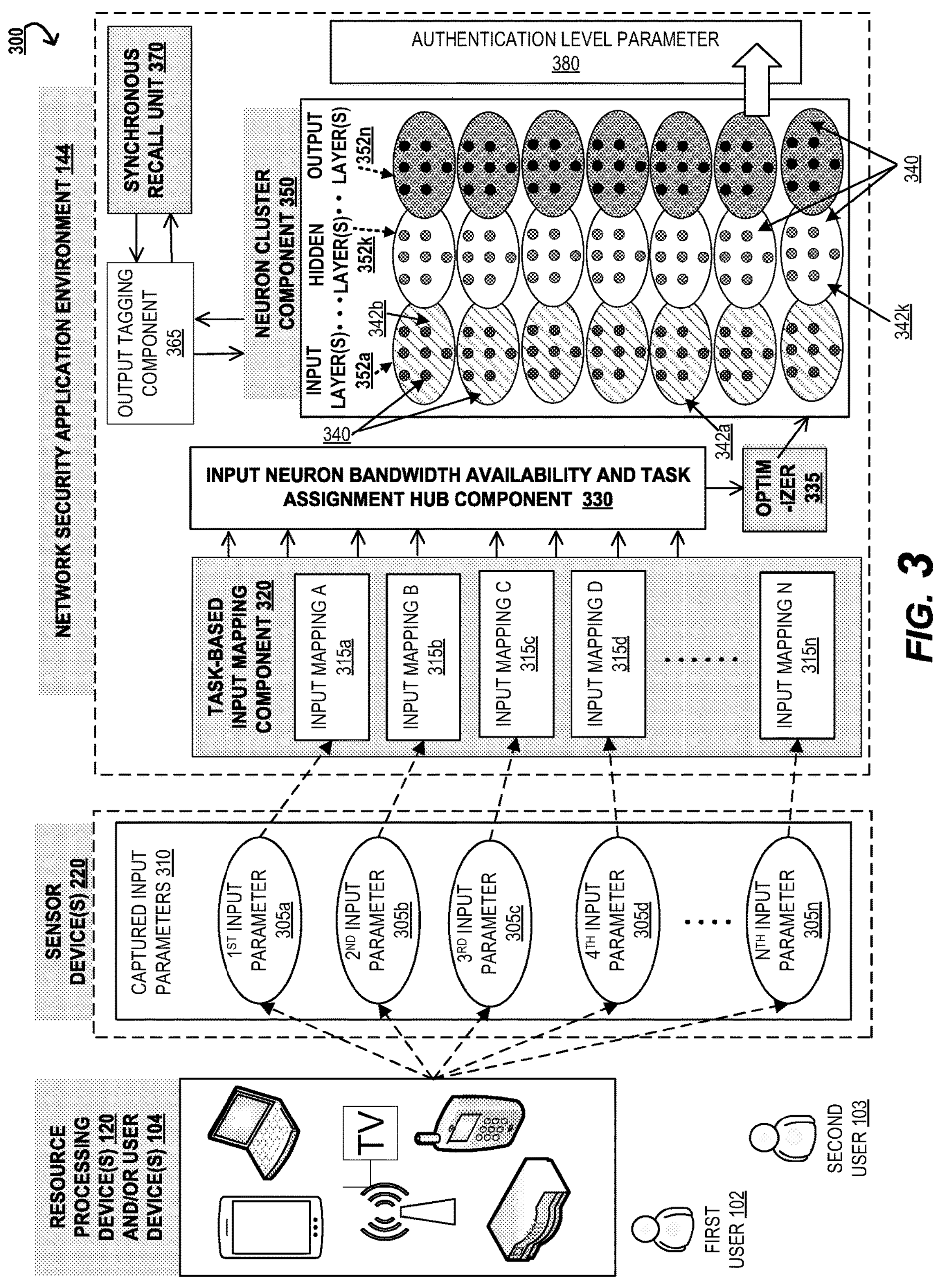
Figure 4A:
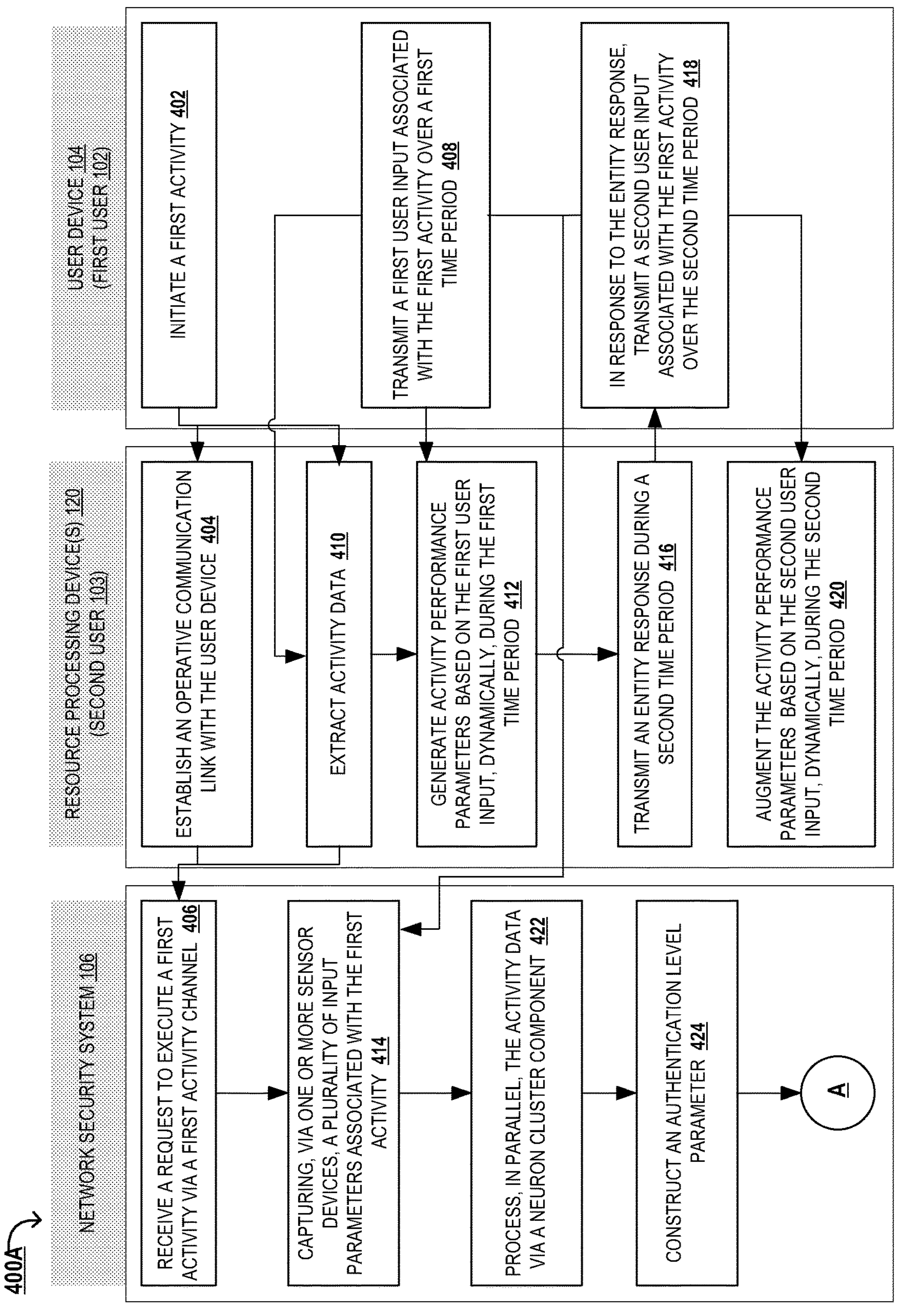
Figure 4B:
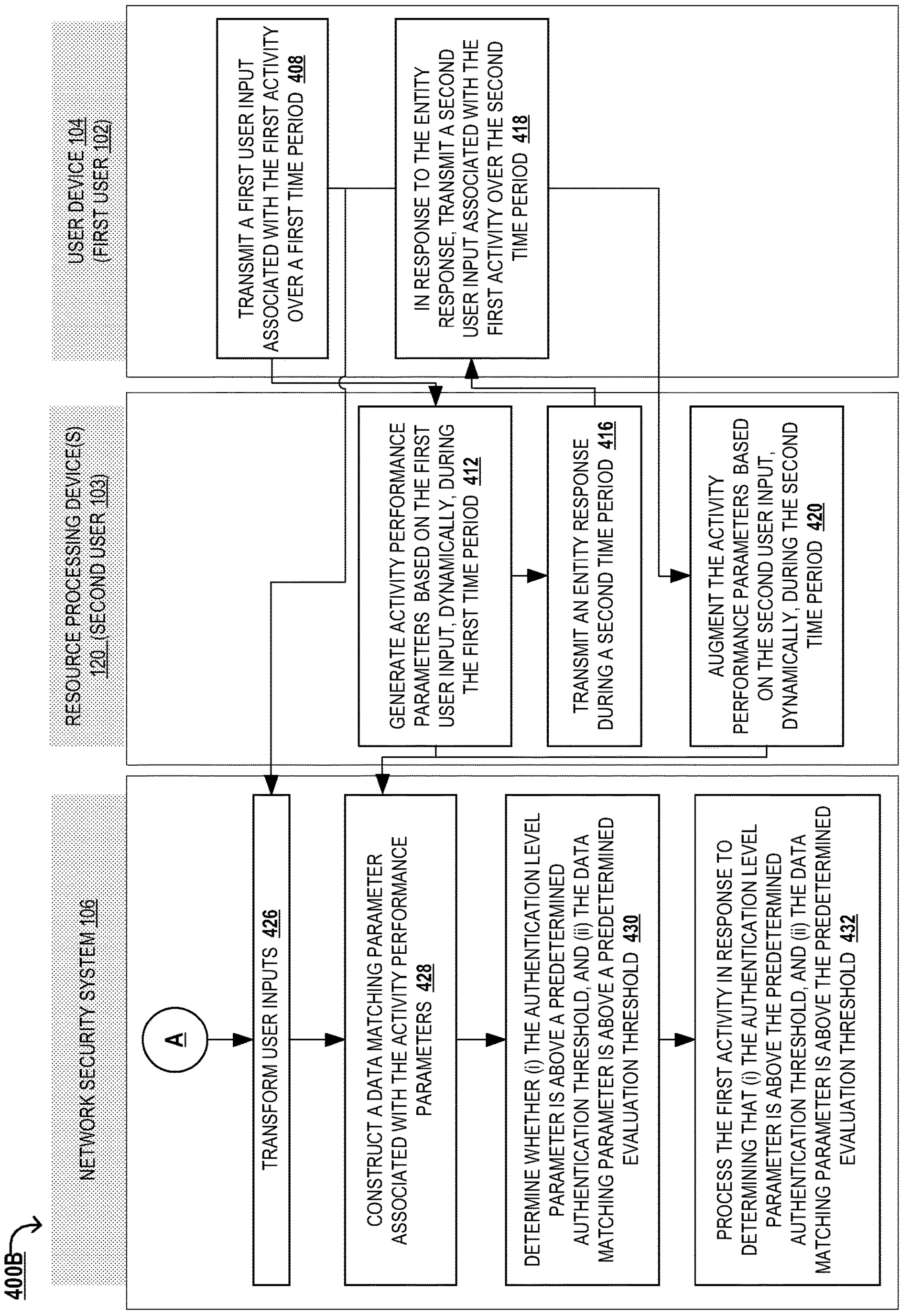

Having thus described embodiments of the invention in general terms, reference will now be made the accompanying drawings, wherein:

FIG. 1 depicts a schematic representation of a network environment 100 for dynamic authentication and processing of electronic activities based on parallel neural network processing, in accordance with one embodiment of the present invention;

FIG. 2 illustrates a schematic representation 200 of a user device, in accordance with embodiments of the present invention;

FIG. 3 depicts a schematic diagram 300 illustrating neuron cluster bandwidth availability based input mapping, process channeling, and parallel neural network processing, via the network environment of FIG. 1, in accordance with one embodiment of the present invention;

FIG. 4A depicts a schematic high-level process flow 400A for dynamic authentication and processing of electronic activities based on parallel neural network processing, in accordance with one embodiment of the present invention;

FIG. 4B depicts a schematic high-level process flow 400B for dynamic authentication and processing of electronic activities based on parallel neural network processing in conjunction with FIG. 4A, in accordance with one embodiment of the present invention; and FIG. 5 depicts a schematic high-level process flow 500 for neuron cluster bandwidth availability based input mapping, process channeling, and parallel neural network processing, in accordance with one embodiment of the present invention.

DETAILED DESCRIPTION OF EMBODIMENTS OF THE INVENTION

Embodiments of the present invention will now be described more fully hereinafter with reference to the accompanying drawings, in which some, but not all, embodiments of the invention are shown. Indeed, the invention may be embodied in many different forms and should not be construed as limited to the embodiments set forth herein; rather, these embodiments are provided so that this disclosure will satisfy applicable legal requirements. Where possible, any terms expressed in the singular form herein are meant to also include the plural form and vice versa, unless explicitly stated otherwise. Also, as used herein, the term "a" and/or "an" shall mean "one or more," even though the phrase "one or more" is also used herein. Furthermore, when it is said herein that something is "based on" something else, it may be based on one or more other things as well. In other words, unless expressly indicated otherwise, as used herein "based on" means "based at least in part on" or "based at least partially on." Like numbers refer to like elements throughout.

In some embodiments, an "entity" as used herein may be a financial institution. For the purposes of this invention, a "financial institution" may be defined as any organization, entity, or the like in the business of moving, investing, or lending money, dealing in financial instruments, or providing financial services. This may include commercial banks, thrifts, federal and state savings banks, savings and loan associations, credit unions, investment companies, insurance companies and the like. In some embodiments, the entity may allow a user to establish an account with the entity. An "account" may be the relationship that the user has with the entity. Examples of accounts include a deposit account, such as a transactional account (e.g., a banking account), a savings account, an investment account, a money market account, a time deposit, a demand deposit, a pre-paid account, a credit account, information provided by the user, or the like. The account is associated with and/or maintained by an entity. In other embodiments, an "entity" may not be a financial institution.

Unless specifically limited by the context, a "user activity", "transaction" or "activity" typically refers to any communication between the user and a financial institution or another entity. In some embodiments, for example, a user activity may refer to a purchase of goods or services, a return of goods or services, a payment transaction, a credit transaction, or other interaction involving a user's bank account. As another example, in some embodiments, a user activity may refer to viewing account balances, modifying user information and contact information associated with an account, modifying alert/notification preferences, viewing transaction/activity history, transferring/redeeming loyalty points and the like. In some embodiments, the user activity is associated with an entity application stored on a user device, for example, a digital wallet application, a mobile/online banking application, a merchant application, a browser application, a social media application and the like. Typically, a user activity is an electronic transaction or electronic activity in which the user is employing a mobile device, computing device, or other electronic device to initiate, execute and/or complete the activity.

As used herein, a "resource" may refer to a bank account, which in turn may refer to a credit account, a debit/deposit account, or the like. Although the phrase "bank account" includes the term "bank," the account need not be maintained by a bank and may, instead, be maintained by other financial institutions. For example, in the context of a financial institution, a user activity or transaction may refer to one or more of a sale of goods and/or services, an account balance inquiry, a rewards transfer, an account money transfer, opening a bank application on a user's computer or mobile device, a user accessing their e-wallet (e.g., mobile wallet) or online banking account or any other interaction involving the user and/or the user's device that is detectable by the financial institution. As further examples, a user activity may occur when an entity associated with the user is alerted via the transaction of the user's location. A user activity may occur when a user accesses a building, uses a rewards card, and/or performs an account balance query. A user activity may occur as a user's device establishes a wireless connection, such as a Wi-Fi connection, with a point-of-sale terminal. In some embodiments, a user activity may include one or more of the following: purchasing, renting, selling, and/or leasing goods and/or services (e.g., groceries, stamps, tickets, DVDs, vending machine items, and the like); withdrawing cash; making payments (e.g., paying monthly bills; paying federal, state, and/or local taxes; and the like); sending remittances; transferring balances from one account to another account; loading money onto stored value cards (SVCs) and/or prepaid cards; donating to charities; and/or the like.

As used herein, an "online banking account" is an account that is associated with one or more user accounts at a financial institution. For example, the user may have an online banking account that is associated with the user's checking account, savings account, investment account, and/or credit account at a particular financial institution. Authentication credentials comprising a username and password are typically associated with the online banking account and can be used by the user to gain access to the online banking account. The online banking account may be accessed by the user over a network (e.g., the Internet) via a computer device, such as a personal computer, laptop, or mobile device (e.g., a smartphone or tablet). The online banking account may be accessed by the user via a mobile or online banking website or via a mobile or online banking application. A customer may access an online banking account to view account balances, view transaction history, view statements, transfer funds, and pay bills. More than one user may have access to the same online banking account. In this regard, each user may have a different username and password. Accordingly, one or more users may have a sub-account associated with the online banking account.

A "user" may be an individual or group of individuals associated with an entity that provides the system for assessing network authentication requirements based on situational instance. In some embodiments, the "user" may be a financial institution user (e.g., an account holder or a person who has an account (e.g., banking account, credit account, or the like)). In one aspect, a user may be any financial institution user seeking to perform user activities associated with the financial institution or any other affiliate entities associated with the financial institution. In some embodiments, the user may be an individual who may be interested in opening an account with the financial institution. In some other embodiments, a user may be any individual who may be interested in the authentication features offered by the financial institution/entity. In some embodiments, a "user" may be a financial institution employee (e.g., an underwriter, a project manager, an IT specialist, a manager, an administrator, an internal operations analyst, bank teller or the like) capable of operating the system described herein. For purposes of this invention, the term "user" and "customer" may be used interchangeably. In the embodiments described herein, "first user" may refer to a customer of the entity, while "second user" may refer to an employee of the entity.

An electronic activity, also referred to as a "technology activity", "technology activity event", or a "user activity", such as a "resource transfer" or "transaction", may refer to any activities or communication between a user or entity and the financial institution, between the user and the entity, activities or communication between multiple entities, communication between technology applications and the like. A resource transfer may refer to a payment, processing of funds, purchase of goods or services, a return of goods or services, a payment transaction, a credit transaction, or other interactions involving a user's resource or account. In the context of a financial institution or a resource entity such as a merchant, a resource transfer may refer to one or more of: transfer of resources/funds between financial accounts (also referred to as "resources"), deposit of resources/funds into a financial account or resource (for example, depositing a check), withdrawal of resources or finds from a financial account, a sale of goods and/or services, initiating an automated teller machine (ATM) or online banking session, an account balance inquiry, a rewards transfer, opening a bank application on a user's computer or mobile device, a user accessing their e-wallet, applying one or more coupons to purchases, or any other interaction involving the user and/or the user's device that invokes or that is detectable by or associated with the financial institution. A resource transfer may also include one or more of the following: renting, selling, and/or leasing goods and/or services (e.g., groceries, stamps, tickets, DVDs, vending machine items, and the like); making payments (e.g., paying monthly bills; and the like); loading money onto stored value cards (SVCs) and/or prepaid cards; donating to charities; and/or the like. Unless specifically limited by the context, a "resource transfer," a "transaction," a "transaction event," or a "point of transaction event," refers to any user activity (financial or non-financial activity) initiated between a user and a resource entity (such as a merchant), between the user and the financial instruction, or any combination thereof. In some embodiments, a resource transfer or transaction may refer to financial transactions involving direct or indirect movement of funds through traditional paper transaction processing systems (i.e. paper check processing) or through electronic transaction processing systems. In this regard, resource transfers or transactions may refer to the user initiating a funds/resource transfer between account, funds/resource transfer as a payment for the purchase for a product, service, or the like from a merchant, and the like. Typical financial transactions or resource transfers include point of sale (POS) transactions, automated teller machine (ATM) transactions, person-to-person (P2P) transfers, internet transactions, online shopping, electronic funds transfers between accounts, transactions with a financial institution teller, personal checks, conducting purchases using loyalty/rewards points etc. When discussing that resource transfers or transactions are evaluated it could mean that the transaction has already occurred, is in the process of occurring or being processed, or it has yet to be processed/posted by one or more financial institutions. In some embodiments, a resource transfer or transaction may refer to non-financial activities of the user. In this regard, the transaction may be a customer account event, such as but not limited to the customer changing a password, ordering new checks, adding new accounts, opening new accounts, adding or modifying account parameters/restrictions, modifying a payee list associated with one or more accounts, setting up automatic payments, performing/modifying authentication procedures, and the like.

In accordance with embodiments of the invention, the term "user" may refer to a customer or the like, who utilizes an external apparatus such as a user device, for executing resource transfers or transactions. The external apparatus may be a user device (computing devices, mobile devices, smartphones, wearable devices, auxiliary devices, and the like), a payment instrument (credit cards, debit cards, checks, digital wallets, currency, loyalty points), and/or payment credentials (account numbers, payment instrument identifiers). In some embodiments, the user may seek to perform one or more user activities using a multi-channel cognitive resource application of the invention, which is stored on a user device (e.g., as a multi-channel cognitive resource user application mobile application of the user's smart phone). In some embodiments, the user may perform transactions by swiping payment instruments at a transaction terminal, for example, by swiping a magnetic strip of a credit card along a magnetic reader of a transaction terminal. In some embodiments, the transactions may be performed by wireless communication or "tapping" between the customer device and a transaction terminal. In accordance with some embodiments of the invention, the term "tap" or "tapping" may refer to bringing an external apparatus close to or within a predetermined proximity of the activity interface device or transaction terminal interface, or auxiliary user devices, so that information (such as encrypted tokens, financial resource/account identifiers, and the like) can be communicated wirelessly between the external apparatus and the devices using short range wireless transmission technology, such near-field communication (NFC) technology, radio-frequency (RF) technology, audio-frequency communication, or the like. Tapping may include physically tapping the user device against an appropriate portion of the auxiliary user device or the transaction terminal or it may include only waving or holding the user device near an appropriate portion of the auxiliary user device or the transaction terminal without making physical contact with the transaction terminal.

Over the last few years, there has been a significant increase in the number of electronic activities, due to widespread use of smartphone, tablet computers, laptop computers, transaction terminals, and electronic computing devices in general which are configured for accepting authentication credentials in electronic form. Identifying and preventing unauthorized exposure of users' electronic information, and ensuring the security of electronic activities is crucial. Specifically, maintaining security of activity data from networked devices and determining authorization of the users and/or the entities involved in the activities is an important concern. Typically, in conventional systems, one or more activities may be initiated using a network device, with the activities seeking to access, modify, transfer, and/or otherwise operate upon secure data and resources associated with a user. However, conventional systems typically process these activities merely based on mere authentication credentials inputted by users (e.g., via audio/voice inputs, typed text inputs, and/or the like). The credentials may be intercepted or accessed by unauthorized entities during transmission via a single communication channel which may then be utilized for future unauthorized user activities without the permission of the user. Moreover, because only a set of one or more credentials, which typically do not change for one user activity to another, are required to be validated for performing the user activity at a point in time, the veracity of the source/provider of credentials cannot be ascertained in conventional systems.

Conventional systems typically cannot detect whether the activities are being initiated by an unauthorized entity/individual in the first place in real-time, and hence undesirably may let the unauthorized activity proceed. Conventional systems typically may only be able to detect that the activity is unauthorized after the activity is processed, rendering them unable to prevent exposure of secure data in real time. Moreover, even if conventional systems belatedly detect the unauthorized activity, they are not configured for tailoring actions to prevent exposure of secure data, if at all, in a manner specific to target the attributes of the unauthorized activity. Conventional systems may only be configured, if at all, for implementation of actions, typically undesirably delayed, only in channels that have been adversely affected in the first place. Accordingly, there is a need for a network security system that solves the foregoing problems in conventional technology and provides real-time detection and real-time prevention of unauthorized activities, in an adaptive proactive manner.

Typically, security/exposure events comprise unauthorized interception, utilization or modification of data at a first instance of time, particularly data that is routinely and necessarily available to an entity during a user activity (for example, a merchant requires payment credential information to process a purchase transaction). However, the associated user or entity may not be able to identify/discover the exposure until the intercepted data is used to perform at least one unauthorized activity/transaction at a later time, while the user's information continues to be unsecured. In such instances, identifying the mode of the exposure and the specific technological parameter that needs to be addressed may be possible, if at all, after a significant time lapse succeeding the unauthorized activity.

The technological advantages and improvements to systems provided by the present invention are threefold. Firstly, the present invention provides proactive and preventative security measures that assess and augment the security of technological parameters for an activity in real-time, before the occurrence of an unauthorized transaction. Secondly, the present invention is configured for dynamic and real-time mitigation operations, i.e., tailoring actions to prevent exposure of user data, in a manner specific to target the attributes of the unauthorized activity. The present invention is structured for cross-channel mitigation operations, which may be implemented across a variety of channels, e.g., other channels not affected by the unauthorized activity, thereby proactively safeguarding a variety of the user's data/resources from current and future unauthorized activities. Thirdly, the present invention involves a novel deployment of neural network technology for the foregoing dynamic authentication and processing of electronic activities. Here, the present invention involves parallel neural network processing via neuron clusters, thereby resulting in significantly reduced processing time, while still accurately mapping the parallelly processed parameters. Moreover, the present invention is structured for improved and enhanced utilization of resources and decreased downtime, by implementing a novel neuron cluster bandwidth availability based input mapping and process channeling, which is not available in conventional systems.

Embodiments of the present invention address the above needs and/or achieve other advantages by providing apparatuses (e.g., a system, computer program product and/or other devices) and methods for dynamic authentication and processing of electronic activities based on parallel neural network processing, as will be described in detail elsewhere in the specification. FIG. 1 illustrates a system environment 100 for a dynamic authentication and processing of electronic activities based on parallel neural network processing, in accordance with one embodiment of the present invention. FIG. 1 provides a unique system that includes specialized servers and systems, communicably linked across a distributive network of nodes required to perform the functions of providing dynamic security paradigms. The authentication system provides a dynamic platform for neuron cluster bandwidth availability based input mapping and process channeling for dynamic detection of security events associated with network devices and resources and triggering real-time mitigation operations.

FIG. 1 illustrates a network environment 100 for dynamic authentication and processing of electronic activities based on parallel neural network processing, in accordance with one embodiment of the present invention. As illustrated in FIG. 1, a network security system 106, is provided configured for dynamic authentication and processing of electronic activities based on parallel neural network processing. Specifically, the network security application environment 144 of the network security system 106 is structured for dynamic authentication and processing of electronic activities based on parallel neural network processing. The network security system 106 is operatively coupled, via a network 101 to one or more user devices 104, auxiliary user devices 170, resource processing devices 120, entity system(s) 180 (e.g., financial institution systems 180), entity databases 190, auxiliary entity system(s) 195 (e.g., authentication system 195), and other external systems/third-party servers not illustrated herein. In this way, the network security system 106 can send information to and receive information from multiple user devices 104, auxiliary user devices 170, resource processing devices 120, entity systems 180, and/or auxiliary entity system(s) 195, via network 101.

The network 101 may be a global area network (GAN), such as the Internet, a wide area network (WAN), a local area network (LAN), or any other type of network or combination of networks. The network 101 may provide for wireline, wireless, or a combination wireline and wireless communication between devices on the network 101. The network 101 is configured to establish an operative connection between otherwise incompatible devices, for example establishing a communication channel, automatically and in real time, between the one or more user devices 104 and one or more of the auxiliary user devices 170 and/or resource processing devices 120, (for example, based on receiving a user input, or when the user device 104 is within a predetermined proximity or broadcast range of the auxiliary devices 170 and/or resource processing devices 120), as illustrated by communication channel 101*a*. Therefore, the system, via the network 101 may establish, operative connections between otherwise incompatible devices, for example by establishing a communication channel 101*a* between the one or more user devices 104 and the auxiliary user devices 170 and/or resource processing devices 120. In this regard, the network 101 (and particularly the communication channels 101*a*) may take the form of contactless interfaces, short range wireless transmission technology, such near-field communication (NFC) technology, near-field low energy communication, audio frequency (AF) waves, wireless personal area network, radio-frequency (RF) technology, and/or other suitable communication channels. Tapping may include physically tapping the external apparatus, such as the user device 104, against an appropriate portion of the auxiliary user device 170 and/or resource processing devices 120, or it may include only waving or holding the external apparatus near an appropriate portion of the auxiliary user device without making physical contact with the auxiliary user device and/or resource processing devices 120.

In some embodiments, the user 102 is an individual that wishes to conduct one or more electronic activities or technology activity events with resource entities, for example using the user device 104. As such, in some instances, the user device may have multiple user applications 122 stored/installed on the user device 104 and the memory device 116 in particular. In some embodiments, the user application 122 is used to conduct one or more electronic activities or technology activity events with resource entities. In some embodiments the user application 122 may refer to a third party application or a user application stored on a cloud used to access the network security system 106 and/or the auxiliary user device 170 through the network 101, communicate with or receive and interpret signals from auxiliary user devices 170, and the like. The user 102 may subsequently navigate through the interface, perform one or more searches or initiate one or more activities or resource transfers using a user interface provided by the user application 122 of the user device 104. In some embodiments, the user 102 may be routed to a particular destination using the user device 104. In some embodiments, a purchase or a transaction may be made by the user 102 using the user device 104. In some embodiments the auxiliary user device 170 requests and/or receives additional information from the network security system 106, entity system 180 and/or the user device 104 for authenticating the user and/or the user device, determining appropriate transaction queues, performing the transactions and other functions.

FIG. 1 also illustrates the user device 104. The user device 104, herein referring to one or more user devices, wherein each device may generally comprise a communication device 110, a display device 112, a geo-positioning device 113, a processing device 114, and a memory device 116. Typically, the user device 104 is a computing system that allows a user 102 to interact with other systems to initiate or to complete activities, resource transfers, and transactions for products, and the like. The processing device 114 is operatively coupled to the communication device 110 and the memory device 116. The processing device 114 uses the communication device 110 to communicate with the network 101 and other devices on the network 101, such as, but not limited to the entity system 180, the auxiliary user device 170, resource processing devices 120, and the network security system 106. As such, the communication device 110 generally comprises a modem, server, or other device for communicating with other devices on the network 101. In some embodiments the network 101 comprises a network of distributed servers. In some embodiments, the processing device 114 may be further coupled to a display device 112, a geo-positioning device 113, and/or a transmitter/receiver device, not indicated in FIG. 1. The display device 112 may comprise a screen, a speaker, a vibrating device or other devices configured to provide information to the user. In some embodiments, the display device 112 provides a presentation of the user interface of the user application 122. The geo-positioning device 113 may comprise global positioning system (GPS) devices, triangulation devices, accelerometers, and other devices configured to determine the current geographic location of the user device 104 with respect to satellites, transmitter/beacon devices, telecommunication towers and the like. In some embodiments the user device 104 may include authentication devices like fingerprint scanners, microphones and the like that are configured to receive bio-metric authentication credentials from the user.

The user device 104 comprises computer-readable instructions 124 stored in the memory device 116, which in one embodiment includes the computer-readable instructions 124 of the user application 122. In this way, users 102 may authenticate themselves, initiate activities, and interact with or receive and decode signals from the auxiliary user devices 170 and/or resource processing devices 120, communicate with the network security system 106, authorize a transaction, and/or complete a transaction using the central user interface of the user device 104. As discussed previously, the user device 104 may be, for example, a desktop personal computer, a mobile system, such as a cellular phone, smart phone, personal data assistant (PDA), laptop, wearable device, a smart TV, a smart speaker, a home automation hub, augmented/virtual reality devices, or the like. The computer readable instructions 124 such as computer readable/executable code of the multi-channel cognitive resource user application 122, when executed by the processing device 114 are configured to cause the user device 104 and/or processing device 114 to perform one or more steps described in this disclosure, or to cause other systems/devices to perform one or more steps described herein. The user device 104 will be described in detail with respect to FIG. 2, later on.

The resource processing devices 120 or transaction terminals as used herein may refer to one or more electronic devices that facilitate user transactions or activities. In this regard the resource processing devices 120 can comprise computing devices, accessories such as headsets, laptop computers, Automated Teller Machines (ATMs), resource terminals or Point of sale devices (POS), vending machines, checkout registers, ticket vending machines, automated retail transaction devices, banking terminals in a financial institution and other transaction terminals that involve financial transactions in one form or another. In some embodiments the resource processing device 120 refers to devices that facilitate execution of non-financial transactions or activities, for example, check-in terminals for various industries, for example: hospitality, travel, and the like, information kiosks and other transaction terminals that do not involve a user performing a financial transaction via the transaction terminal. In some embodiments the resource processing devices 120 facilitate execution of both financial and non-financial transactions/activities. In some embodiments, resource processing devices 120 may refer to user devices that facilitate financial and/or non-financial transactions, such as laptop computers, tablet computers, smartphones, wearable devices, personal digital assistants (PDAs), and other portable or stationary computing devices. In some embodiments, the resource processing devices 120 may be owned, operated and/or otherwise associated entities and are installed at suitable locations, such that the user can travel to the location of the resource processing device to execute transactions. In some embodiments, the resource processing device 120 may be owned, operated and/or otherwise associated with an entity, such as a financial institution. In some embodiments, the resource processing devices 120 may be owned, operated and/or otherwise associated with the user. The embodiments described herein may refer to the initiation and completion of an electronic activity, a user activity or a transaction.

As illustrated by FIG. 1, the resource processing device 120 may comprise an ATM 120*a*, a resource terminal 120*b* (e.g., a point of sale terminal 120*b*), a user device 120*c* (such as one or more user device 104 and/or one or more auxiliary user devices 170), vending machines and/or other devices that are configured to facilitate the user activity. The user device 120*c* may be one of the user devices 104 and may comprise a mobile communication device, such as a cellular telecommunications device (i.e., a smart phone or mobile phone), a computing device such as a laptop computer, a personal digital assistant (PDA), a mobile Internet accessing device, or other mobile device including, but not limited to portable digital assistants (PDAs), pagers, mobile televisions, laptop computers, cameras, video recorders, audio/video player, radio, GPS devices, any combination of the aforementioned, or the like. The resource processing device 120 may include a communication device, a processing device, a user interface, an authentication device and a memory device having an authentication application/module, a resource datastore and one or more processing applications stored therein.

In some embodiments, the network security system 106 (also referred to as the cross-channel network security system environment 106) comprises a plurality of networked devices, systems, applications, sensors, an electronic communication generating and network security application environment 144 (detailed in FIG. 3) and/or servers associated with technology infrastructure of an entity, in operative communication therebetween (e.g., as illustrated in FIG. 3 described later on). As further illustrated in FIG. 1, the network security system 106 generally comprises a communication device 136, at least one processing device 138, and a memory device 140. As used herein, the term "processing device" generally includes circuitry used for implementing the communication and/or logic functions of the particular system. For example, a processing device may include a digital signal processor device, a microprocessor device, and various analog-to-digital converters, digital-to-analog converters, and other support circuits and/or combinations of the foregoing. Control and signal processing functions of the system are allocated between these processing devices according to their respective capabilities. The processing device may include functionality to operate one or more software programs based on computer-readable instructions thereof, which may be stored in a memory device.

The processing device 138 is operatively coupled to the communication device 136 and the memory device 140. The processing device 138 uses the communication device 136 to communicate with the network 101 and other devices on the network 101, such as, but not limited to the entity systems 180, auxiliary user devices 170, resource processing devices 120, sensor devices 220 (illustrated in FIGS. 1-3), and/or the user device 104. The processing device 138 uses the communication device 136 to communicate with the network 101 and other devices of the entity's technology infrastructure, such as, but not limited to plurality of networked devices, systems, technology applications, and network security application environment 144 (whose operations/features are schematically illustrated in FIG. 3) and/or servers that may be located across various geographical locations, e.g., via an entity network (not illustrated). As such, the communication device 136 generally comprises a modem, server, wireless transmitters, or other devices for communicating with devices on the network 101. The memory device 140 typically comprises a non-transitory computer readable storage medium, comprising computer readable/executable instructions/code, such as the computer-readable instructions 142, as described below.

As further illustrated in FIG. 1, the network security system 106 comprises computer-readable instructions 142 or computer readable program code 142 stored in the memory device 140, which in one embodiment includes the computer-readable instructions 142 of a network security application 144 or a network security application environment 144. The computer readable instructions 142, when executed by the processing device 138 are configured to cause the system 106/processing device 138 to perform one or more steps described in this disclosure to cause out systems/devices (such as the user device 104, the user application 122, resource processing devices 120, entity system 180, entity database 190, and the like) to perform one or more steps described herein. In some embodiments, the memory device 140 includes a data storage for storing data related to user transactions and resource entity information, but not limited to data created and/or used by the network security application 144. The network security application 144, when operated by the processing device 138 is structured for dynamic authentication and processing of electronic activities based on parallel neural network processing.

FIG. 1 further illustrates one or more auxiliary user devices 170, in communication with the network 101. The auxiliary user devices may comprise peripheral devices such as speakers, microphones, smart speakers, and the like, display devices, a desktop personal computer, a mobile system, such as a cellular phone, smart phone, personal data assistant (PDA), laptop, wearable device, a smart TV, a smart speaker, a home automation hub, augmented/virtual reality devices, or the like. In some embodiments, the structure and/or functioning of the auxiliary user devices 170 is substantially similar to that of the user device(s) 104, while in other embodiments, the auxiliary user devices 170 supplement/enhance the structure and/or functioning of the user device(s) 104.

Typically, the processing device 138 is operatively coupled to, and/or structured to control/cause (e.g., based on executing the instructions 142), directly or indirectly, one or more sensor devices 220 to capture a plurality of input parameters associated with the first activity and transmit the captured parameters to the network security system 106. The one or more sensor devices 220 may be associated with, provided at, and/or directly controlled by, the network security system 106 (e.g., in the form of an internet protocol (IP) sensor structured to capture internet protocol (IP) parameters such as IP address, IP origination country and/or the like, a timer sensor, etc.), the user device (e.g., in the form of a positioning system device (e.g., a GPS device), audio capture sensors such as microphone-based sensors, audio/video sensors such as camera-based sensors, and/or the like, as illustrated by FIG. 2), and/or the resource processing device(s) 120 (e.g., in the form of a positioning system device (e.g., a GPS device), audio capture sensors such as microphone-based sensors, audio/video sensors such as camera-based sensors, and/or the like).

FIG. 2 illustrates a schematic representation 200 of a user device 104, in accordance with embodiments of the present invention. The user device 104 may also be referred to as a "user mobile device" 104 may be any mobile communication device, such as a cellular telecommunications device (i.e., a cell phone or mobile phone), personal digital assistant (PDA), a mobile Internet accessing device, or another user mobile device including, but not limited to portable digital assistants (PDAs), pagers, mobile televisions, laptop computers, cameras, video recorders, audio/video player, radio, GPS devices, any combination of the aforementioned devices.

The user mobile device 104 may generally include a processing device or processor 114 communicably coupled to devices such as, a memory device 116, user output devices 230 (for example, a user display device 112, or a speaker 234), user input devices 240 (such as a microphone, keypad, touchpad, touch screen, and the like), a communication device or network interface device 112, a power source 215, a clock or other timer 280, a visual capture device such as a camera 250, a positioning system device 113, such as a geo-positioning system device like a GPS device, an accelerometer, and the like, one or more chips, and the like. The processor 114 may further include a central processing unit 202, input/output (I/O) port controllers 204, a graphics controller 205, a serial bus controller 206 and a memory and local bus controller 208.

The processor 114 may include functionality to operate one or more software programs or applications, which may be stored in the memory device 116. For example, the processor 114 may be capable of operating applications such as the user application 122. The user application 122 may then allow the user mobile device 104 to transmit and receive data and instructions from second networked device 180*b* (e.g., via the channel 10*c*), the authentication system 108 and/or the resource processing system 106, web content, such as, for example, location-based content and/or other web page content, according to a Wireless Application Protocol (WAP), Hypertext Transfer Protocol (HTTP), and/or the like.

The user application 122 may include the necessary circuitry to provide token storage and transmission functionality, transmitter device signal encoding and decoding functionality to the user mobile device 104, for secure transmission of financial and authentication credential tokens via the contactless communication interface 279 to the second networked device 180*b*. That said, in some embodiments the user application 122 is pre-installed on the user mobile device 104, while in other embodiments, the authentication system 108 and/or the resource processing system 106 may transmit and cause installation of the application 122 based on determining that the user mobile device 104 does not comprise the application 122.

The processor 114 may be configured to use the network interface device 112 to communicate with one or more other devices on a network 101 such as, but not limited to the second networked device 180*b*, the authentication system 108 and/or the resource processing system 106. In this regard, the network interface device 112 may include an antenna 276 operatively coupled to a transmitter 274 and a receiver 272 (together a "transceiver"), modem 278 and a contactless communication interface 279. The processor 114 may be configured to provide signals to and receive signals from the transmitter 274 and receiver 272, respectively. The signals may include signaling information in accordance with the air interface standard of the applicable BLE standard, cellular system of the wireless telephone network and the like, that may be part of the network 101. In this regard, the user mobile device 104 may be configured to operate with one or more air interface standards, communication protocols, modulation types, and access types. By way of illustration, the user mobile device 104 may be configured to operate in accordance with any of a number of first, second, third, and/or fourth-generation communication protocols and/or the like. For example, the user mobile device 104 may be configured to operate in accordance with second-generation (2G) wireless communication protocols IS-136 (time division multiple access (TDMA)), GSM (global system for mobile communication), and/or IS-95 (code division multiple access (CDMA)), or with third-generation (3G) wireless communication protocols, such as Universal Mobile Telecommunications System (UMTS), CDMA2000, wideband CDMA (WCDMA) and/or time division-synchronous CDMA (TD-SCDMA), with fourth-generation (4G) wireless communication protocols, and/or the like. The user mobile device 104 may also be configured to operate in accordance with non-cellular communication mechanisms, such as via a wireless local area network (WLAN) or other communication/data networks. The user mobile device 104 may also be configured to operate in accordance Bluetooth® low energy, audio frequency, ultrasound frequency, or other communication/data networks.

The network interface device 112 or communication device 112 may also include a user activity interface presented in user output devices 230 in order to allow a user 102 to execute some or all of processes described herein. The application interface may have access to the hardware, for example, the transceiver, and software previously described with respect to the network interface device 112. Furthermore, the application interface may have the ability to connect to and communicate with an external data storage on a separate system within the network 101. As described above, the user mobile device 104 includes a display device 112 having a user interface that includes user output devices 230 and/or user input devices 240. The user output devices 230 may include a display 112 (e.g., a liquid crystal display (LCD) or the like) and a speaker 234 or other audio device, which are operatively coupled to the processor 114. The user input devices 240, which may allow the user mobile device 104 to receive data from the user 102, may include any of a number of devices allowing the user mobile device 104 to receive data from a user 102, such as a keypad, keyboard, touch-screen, touchpad, microphone, mouse, joystick, other pointer device, button, soft key, and/or other input device(s).

The user mobile device 104 may further include a power source 215 (e.g., a rechargeable DC power source). Generally, the power source 215 is a device that supplies electrical energy to an electrical load. In some embodiment, power source 215 may convert a form of energy such as solar energy, chemical energy, mechanical energy, and the like, to electrical energy. Generally, the power source 215 in a user mobile device 104 may be a battery, such as a lithium battery, a nickel-metal hydride battery, or the like, that is used for powering various circuits, for example, the transceiver circuit, and other devices that are used to operate the user mobile device 104. Alternatively, the power source 215 may be a power adapter that can connect a power supply from a power outlet to the user mobile device 104. In such embodiments, a power adapter may be classified as a power source "in" the user mobile device 104.

As discussed previously, the user device 104 comprises computer-readable instructions 124 and data storage 118 stored in the memory device 116, which in one embodiment includes the computer-readable instructions 124 of a user application 122. The user mobile device 104 may also include a memory buffer, cache memory or temporary memory device operatively coupled to the processor 114. Typically, one or more applications such as the user application 122, are loaded into the temporarily memory during use. As used herein, memory may include any computer readable medium configured to store data, code, or other information. The memory device 116 may include volatile memory, such as volatile Random-Access Memory (RAM) including a cache area for the temporary storage of data. The memory device 116 may also include non-volatile memory, which can be embedded and/or may be removable. The non-volatile memory may additionally or alternatively include an electrically erasable programmable read-only memory (EEPROM), flash memory or the like.

In some instances, the user mobile device 104 comprises sensor devices 240 comprising biometric sensors for capturing parameters associated with the user, such as fingerprint scanners, voice recognition sensors, facial recognition sensors, user stress level sensors and the like. These biometric sensors 240 are configured to retrieve, receive, analyze and or validate biometric credentials associated with the user. In this regard, the biometric sensors 240 may comprise optical sensors, ultrasonic sensors, and/or capacitance sensors. The biometric sensors may further comprise radio frequency, thermal, pressure, piezo-resistive/piezoelectric, microelectromechanical sensors, and the like. It is noted that any of the foregoing sensors or capture devices associated with the user device 104 may constitute, at least in part, the one or more sensor devices 220 for capturing a plurality of input parameters associated with the first activity. As a non-limiting example, the one or more sensor devices 220 that are structured to capture one or more input parameters associated with the first activity, may comprise the user input devices 240 (such as a microphone, keypad, touchpad, touch screen, and the like), the communication device or network interface device 112, the clock or other timer 280, the visual and/or audio capture device such as a camera 250, the positioning system device 113, such as a geo-positioning system device like a GPS device, the accelerometer, and/or the like.

FIG. 3 depicts a schematic diagram 300 illustrating neuron cluster bandwidth availability based input mapping, process channeling, and parallel neural network processing, via the network environment of FIG. 1, in accordance with one embodiment of the present invention. The functions and features described herein may be performed, at least in part, by the network security system 106 via the network security application 144, in some embodiments. The network security system 106 and the network security application 144 in particular is structured for dynamic authentication and processing of electronic activities based on parallel neural network processing. The network security system 106 and the network security application 144 in particular is also structured for dynamic authentication and processing of electronic activities based on parallel neural network processing.

As discussed, the user may seek to perform one or more activities. Each of these activities are typically associated with activity data comprising one or more "technology attributes", also referred to as "tiers", which delineate the characteristics, compatible functions, network devices, resources, actions and/or the like for the activity. Typically, in some embodiments, each activity is initiated by the user via a network device, to perform a particular action on/using a particular resource. In this regard, the first user 102 may establish an operative communication channel with the second user 103 associated with an entity, for directing and/or authorizing the second user 103 to conduct the first activity on the first user 102's behalf. Here, the second user 103 may receive, from a first network device/user device 104, a request to execute a first activity via a first activity channel (e.g., an audio communication channel such as a telephonic communication channel, a non-audio communication channel such as an online web-based textual communication channel, and/or the like). Subsequently, the first user 102 and second user 103 may conduct a conversation, i.e., engage in a dialog with the first user 102 providing one or more user inputs associated with the activity, interspersed with entity responses provided by the second user 103 (e.g., an audio/telephonic conversation/dialog, a textual conversation dialog, etc.). The second user 103 may then process the first activity accordingly.

Typically, as discussed previously, the user 102 may be associated with/operate upon, one or more devices (one or more of the user device(s) 104 and/or resource processing device(s) 120) with each device being associated with device tier attributes such as device data (e.g., device identifier data, geo-location data, etc.), application data (e.g., stored applications, etc.), device communication channel (e.g., associated communication network type such as wireless/Wi-Fi communication network, near-field communication, wired/contact based communication, network characteristics such as network security, etc.), and/or the like.

As illustrated by FIG. 2, the network security system 106 may receive an activity request to execute a first activity from a first network device (e.g., one or more of the user device(s) 104 and/or resource processing device(s) 120). The system 106, via the network security application environment 144, may then extract activity data regarding the first network device and the first resource. Typically, the one or more sensor devices 220 capture a plurality of input parameters 310 associated with the first activity. As illustrated, the captured input parameters 310 may comprise, a first input parameter 305*a*, a second input parameter 305*b*, a third input parameter 305*c*, a fourth input parameter 305*d*, . . . , and/or, a $N^{th}$ input parameter 305*n*. As non-limiting examples, the first input parameter 305*a* may comprise current geographic location parameter associated with the user (e.g., captured via the positioning system device sensor 113 of the user device 104), the second input parameter 305*b* may comprise voice state parameter (e.g., associated with emotions of the user's voice during the conversation/dialog comprising a word speed/frequency value, a fear component value, and/or the like) associated with the user (e.g., captured via a microphone device sensor of the user device 104, the resource processing device(s) 120, and/or the system 106), the third input parameter 305*c* may comprise voice sample associated with the user captured during the conversation/dialog (e.g., captured via a microphone device sensor of the user device 104, the resource processing device(s) 120, and/or the system 106), the fourth input parameter 305*d* may comprise actual time zone associated with the user (e.g., captured via a timer/clock device sensor of the user device 104, the resource processing device(s) 120, and/or the system 106), a fifth input parameter 305*e* (not illustrated) may comprise an internet protocol (IP) parameter associated with the user device 104 (e.g., captured via an internet protocol (IP) sensor of the user device 104, the resource processing device(s) 120, and/or the system 106), a sixth input parameter 305*f* (not illustrated) may comprise authentication credentials provided by the user during the conversation/dialog, . . . , and/or, the $N^{th}$ input parameter 305*n* may comprise speech to text transformation of the voice sample (e.g., captured and/or constructed via an audio processing and transformation sensor of the system 106).

In embodiments where the request to execute the first activity via the first activity channel is associated with an audio communication channel, the plurality of input parameters may comprise a location parameter, a voice state parameter, an audio capture file, and a time parameter. In embodiments where, the request to execute the first activity via the first activity channel is associated with a non-audio communication channel, the plurality of input parameters associated with the first activity may comprise a location parameter, an internet protocol (IP) parameter, and a time parameter.

The network security system 106 (also referred to as the system 106 or "the system"), via the network security application environment 144, typically processes the activity data by controlling a neuron cluster component 350. In this regard, the system performs task-based input mapping of the plurality of input parameters 310 associated with the first activity (e.g., via the task-based input mapping component 320). Here, data associated with the plurality of input parameters 310 is analyzed. Moreover, for each input parameter of the plurality of input parameters 310, an associated processing task type is determined. Subsequently, each input parameter of the plurality of input parameters 310 is mapped to the associated processing task type (e.g., as indicated by input mapping elements 315*a*-315*n* of FIG. 3). The processing tasks are typically associated with the processes to be performed for validating the captured input parameters 310 for determining the authentication level for the activity. Here, the processing tasks are tailored to the type of the captured input parameter 310 so that the processing task is compatible with the specific parameter. Based on the specific captured input parameter 310, the system may determine the processing task-type of comparing the captured parameter with a compatible previously validated credential/parameter, determining whether the captured parameter is within a predetermined threshold range, verifying absence or presence of certain indicators in the captured parameter, comparing the captured parameter with the activity data and entity inputs generated by the second user 103, and/or the like.

As a non-limiting example, for the first input parameter 305*a* of the current geographic location parameter type, input mapping A 315*a* may comprise comparison of captured current geographic location parameter type with previously validated original geo location parameters (e.g., associated with a location data comparison task type). Similarly, for the second input parameter 305*b* of the voice state parameter type, input mapping B 315*b* may comprise identification of presence of emotion indicators (e.g., a fear component value being above a certain threshold) and/or determination of value of the emotion indicators (e.g., a word speed/frequency value) in the captured voice sample (e.g., associated with voice state indicator determination task type), as a non-limiting example. As another non-limiting example, for the third input parameter 305*c* of the voice sample type, input mapping C 315*c* may comprise matching of user voice in the captured voice sample during the conversation/dialog with previously validated voice sample of the user (e.g., associated with a voice data comparison task type). As another non-limiting example, for the fourth input parameter 305*d* of the actual time zone type, input mapping D 315*d* may comprise comparison of the captured time zone during the conversation/dialog with previously validated time zones associated with the user (e.g., associated with a time data comparison task type). As another non-limiting example, for the fifth input parameter 305*e* (not illustrated) of the internet protocol (IP) parameter type, input mapping E 315*e* (not illustrated) may comprise comparison of the captured IP parameter during the conversation/dialog with previously validated IP parameters associated with the user (e.g., associated with a network data comparison task type). As yet another non-limiting example, for the sixth input parameter 305*f* (not illustrated) of the authentication credential type, input mapping F 315*f* (not illustrated) may comprise comparison of the authentication credentials (e.g., answers to security questions) provided by the user 102 with previously validated credentials associated with the user (e.g., associated with a credential validation task type). As yet another non-limiting example, for the $N^{th}$ input parameter 305*n* of the speech to text transformation type, input mapping N 315*n* may comprise determining parameters transaction accuracy of the activity data and entity inputs generated by the second user 103 in comparison with the inputs provided by the user 102 (e.g., associated with a parameter accuracy task type).

Typically, the neuron cluster component 350 comprises a plurality of neuron clusters 340 associated with a plurality of neuron layers 352 (e.g., input layers 352*a*, hidden layers 352*k*, output layers 352*n*. and/or the like). The system determines bandwidth availability of the plurality of neuron clusters 340 of the neuron cluster component 350 (e.g., via the input neuron bandwidth availability and task assignment hub component 330). The bandwidth availability is associated with the available processing capacity of the neuron cluster. Next, the system triggers a first neuron cluster 342*a* of the plurality of neuron clusters 340 for processing a first input parameter (e.g., input parameter 305*a*, etc.) of the plurality of input parameters 310 (e.g., via the optimizer component 335), in response to determining that (i) the bandwidth availability of the first neuron cluster 342*a* is above a predetermined threshold (i.e., that the first neuron cluster 342*a*'s available processing capacity is greater than or equal to that required for processing the first input parameter (e.g., input parameter 305*a*, etc.) in accordance with the associated input mapping) and (ii) the first neuron cluster 342*a* matches the task-based input mapping associated with the first input parameter (e.g., input parameter 305*a*, etc.) (i.e., the first neuron cluster 342*a* is compatible with and capable of performing at least a portion of the processing task(s) if the associated input mapping). As illustrated, the first neuron cluster 342*a* is associated with a first neuron layer (e.g., input layer(s) 352*a*).

In parallel to the above, the system triggers a second neuron cluster 342*b* of the plurality of neuron clusters 340 for processing a second input parameter (e.g., input parameter 305*b*, etc.) of the plurality of input parameters 310 (e.g., via the optimizer component 335), in response to determining that (i) the bandwidth availability of the second neuron cluster 342*b* is above a predetermined threshold (i.e., that the second neuron cluster 342*b*'s available processing capacity is greater than or equal to that required for processing the second input parameter (e.g., input parameter 305*b*, etc.) in accordance with the associated input mapping) and (ii) the second neuron cluster 342*b* matches the task-based input mapping associated with the second input parameter (e.g., input parameter 305*b*, etc.) (i.e., the second neuron cluster 342*b* is compatible with and capable of performing at least a portion of the processing task(s) if the associated input mapping). As a non-limiting example, the second neuron cluster 342*b* may be associated with a first neuron layer (e.g., input layer(s) 352*a*). It is noted that in other embodiments not illustrated herein, the first neuron cluster 342*a* and/or the second neuron cluster 342*b* may be associated with the hidden layer(s) 352*k*, the output layer(s) 352*n*, etc. Moreover, similar to the first and second input parameters, the system may trigger other neuron clusters of the plurality of neuron clusters 340 for processing the third input parameter to the $N^{th}$ input parameter of the plurality of input parameters 310 (e.g., via the optimizer component 335), in parallel based on the associated bandwidth availability and compatibility with the tasks.

Next, the system causes/controls the first neuron cluster 342*a* to perform a first processing function on the first input parameter (e.g., input parameter 305*a*, etc.) of the plurality of input parameters 310. This is performed in parallel with performing a second processing function on a second input parameter (e.g., input parameter 305*b*, etc.) of the plurality of input parameters 310 via a second neuron cluster 342*b* of the plurality of neuron clusters 340, . . . , an $N^{th}$ processing function on the $N^{th}$ input parameter, and/or the like.

Subsequently, in response to the first processing function on the first input parameter (e.g., input parameter 305*a*, etc.)

of the plurality of input parameters 310 via the first neuron cluster 342*a*, the system may trigger a third neuron cluster 342*k* of the plurality of neuron clusters 340 for performing a third processing function on the first input parameter (e.g., input parameter 305*a*, etc.) of the plurality of input parameters 310 (e.g., via the optimizer component 335). Here, as illustrated, the third neuron cluster 342*k* is associated with a second neuron layer (e.g., hidden layer(s) 352*k*) that is downstream from the first neuron layer (e.g., input layer(s) 352*a*) associated with the first neuron cluster 342*a*. As a non-limiting example, the first processing function may be associated with a pre-processing or initial step/stage associated with the input mapping task, while the third processing function may be associated with a next/sequential processing step/stage for achieving the input mapping task.

Moreover, although the neuron cluster bandwidth availability based input mapping, process channeling, and parallel neural network processing of FIG. 3 is described with respect to a single activity, it is noted that input parameters associated with multiple activity may be captured and processed in parallel. As such, not only are multiple discrete activities processed in parallel, the myriad input parameters thereof are processed in parallel as well. As such, because the input parameters across multiple activities are processed in parallel, as described above, the results output by the neuron cluster component 350 may be disjointed, out of sequence, separated from the associated activity, and/or the like.

To resolve this inherent problem in the technology, the system may link, via a synchronous recall unit 370 and the output tagging component 365, parameter outputs of the plurality of processing outputs associated with the first activity from the neuron cluster component 350, and other outputs with their associated activities. Here, a plurality of processing outputs from the neuron cluster component 350 are detected. Next, parameter outputs of the plurality of processing outputs associated with the plurality of input parameters 310 of the first activity are ascertained. Subsequently, each of the parameter outputs of the plurality of processing outputs are tagged with an identifier associated with the first activity.

Subsequently, the neuron cluster component constructs an authentication level parameter associated with the parameter outputs for the first activity. The authentication level parameter indicates whether the captured input parameters 310 match an authentication level required for validating the security of the first activity. In some embodiments, the authentication level parameter takes the form of an authentication evaluation score associated with predetermined authentication threshold, above which the authentication evaluation score is compatible for validating the security of the first activity, and below which the authentication evaluation score is not compatible for validating the security of the first activity.

FIGS. 4A-4B depict a schematic high-level process flows 400A-400B for dynamic authentication and processing of electronic activities based on parallel neural network processing, in accordance with one embodiment of the present invention. The functions and features described herein may be performed, at least in part, by the network security system 106 via the network security application 144, in some embodiments.

In this regard, the first user may initiate a first activity at block 402 via a second user 103 at a resource processing device 120. In this regard, the first user 102 may establish an operative communication channel with the second user 103 associated with an entity, for directing and/or authorizing the second user 103 to conduct the first activity on the first user 102's behalf. In response, the system may establish an operative communication link between the user device 104 the resource processing device 120, at block 404. As indicated by block 406, system may receive, from a first network device, a request to execute a first activity via a first activity channel. Typically, the first activity is associated with a first resource. The user activity may comprise one or more actions/tasks/activities associated with the first resource associated with an entity or a financial institution described previously. In this regard, the user may employ a user device 104, (e.g., a mobile device or another computing device) to perform an electronic activity (e.g., in which the user interacts with an entity/merchant system). For example, the user may access and/or perform another activity (e.g., transfer funds) using an online banking account at a financial institution. By way of further example, the user may perform a mobile wallet transaction. As another example, the user may purchase goods or services using a bank account at a financial institution. In some embodiments, the request comprises the user accessing or opening an application associated with the activity, via the user mobile device. For example, the user opening a mobile banking application to view account balances or opening a page within the application to modify account preferences. Typically, the system establishes an operative communication link with the mobile device of the user, and the request is received via this communication link.

Typically, execution of the user activity requires validation of one or more authentication credentials, based on the type of activity. In this regard, the user activity may be associated one or more authentication credentials related to an existing level of authentication. For example, a user activity comprising accessing a mobile device application may be require authentication using a username and password. The credentials of username and password may be associated with a first. low level of authentication. As another example, another user activity comprising initiating a purchase using a user application may require credentials with a second, higher level of authentication, for example payment instrument identifiers and their associated personal identification numbers (PIN). However, these credentials may be obtained by unauthorized individuals. However, the existing level or authentication, associated with the activity itself, may not be satisfactory in instances where the user may be potentially exposed to misappropriation or in instances where chances of unauthorized access to the user's personal and financial information is heightened. With electronic activities becoming ubiquitous, the technological parameters associated with the user activity or the situational instance of the user activity, like the method of conducting the activity (online, mobile, purchase transactions using tokens, card present transaction, and the like), the technical aspects of the device used to conduct the activity (network connections, stored applications, authentication features), physical location of the user activity, merchants and other entities that gain access to user's financial/personal information (in both electronic and physical forms) in the course of the activity, influence the security and assurance in the user activity. Since the methods and modes of intercepting personal information and exposure in electronic activities are greater in number and technically varied, in comparison with non-electronic transactions like payment with cash/currency, there is a need for effective systems to safeguard personal and financial information and to mitigate exposure of electronic activities. The present invention provides a novel solution configured to dynamically assess the network security, based on the both the type of the user activity and the technological parameters/situational instance of the user activity, in real-time, to ensure security and safety of the user's financial and personal information. For example, the system may determine that conducting a first user activity in an unsecured/unknown wireless communication area may potentially adversely affect the security of the user's personal information. In such instances, the system may escalate, in real-time, the required level of authentication from the existing level (for example, a passcode) to an additional authentication response at a higher level (for example, a fingerprint scan) for executing the user activity as long as the parameters associated with the activity deem to require such. Continuing with the example, for the first user activity, the system may escalate the authentication level from a first level to a higher second level as long as the user is in the vicinity of the unsecure wireless communication area and then reduce the authentication level back to the first level when the user is in secure/known wireless communication area like the user's home or within the premises of a financial institution, to expedite the process. In some embodiments, the system may determine that escalation of the level of authentication for a certain user activity is required based on historical exposure events as described in detail below. In some embodiments, the system may deny/decline the request to execute a user activity based on the congruence of the technological parameters/situational instance of the user activity and certain historical exposure events, to safeguard personal information.

Here, the system may extract and analyze activity data regarding the first network device and the first resource, as indicated by block 410. The system 106 may then extract activity data regarding the first network device and the first resource. The activity data may comprise technology attribute/tier data associated with the activity request, user information provided by the user, historical user activity logs, and/or the like. In some embodiments, extracting activity data regarding the first network device and the first resource comprises at least constructing the relevant technology attribute/tier data associated with the activity request.

The system may then analyze, dynamically and in real-time, activity data regarding the activity request, e.g., the associated originating device channel, resource, activity, etc. Here, the network security system may analyze the activity data, dynamically and in real-time, to determine whether the activity request is associated with an exposure event or security event (e.g., associated with an existing exposure event, a potential future exposure event, etc.) and to determine how to prevent the exposure event from occurrence or completion so that the user's data and resources are not adversely affected therefrom.

In this regard, the first user 102 may establish an operative communication channel with the second user 103 associated with an entity, for directing and/or authorizing the second user 103 to conduct the first activity on the first user 102's behalf. Here, the first user 102 and second user 103 may conduct a conversation, i.e., engage in a dialog with the first user 102 providing one or more user inputs associated with the activity (at blocks 408 and 418), interspersed with entity responses provided by the second user 103 (at block 416). The second user 103 may generate activity performance parameters based on the user inputs provided by the first user (e.g., as indicated by block 412) and augment these as the conversation progresses (e.g., as indicated by block 420).

Typically, the system may cause the one or more sensor devices 220 to capture a plurality of input parameters 310 associated with the first activity, as indicated by block 414. The captured input parameters 310 may comprise, as non-limiting examples, the first input parameter 305*a*, the second input parameter 305*b*, the third input parameter 305*c*, the fourth input parameter, . . . , and/or, the nth input parameter 305*n*. As non-limiting examples, the first input parameter 305*a* may comprise current geographic location parameter associated with the user (e.g., captured via the positioning system device sensor 113 of the user device 104), the second input parameter 305*b* may comprise voice state parameter (e.g., associated with emotions of the user's voice during the conversation/dialog comprising a word speed/frequency value, a fear component value, and/or the like) associated with the user (e.g., captured via a microphone device sensor of the user device 104, the resource processing device(s) 120, and/or the system 106), the third input parameter 305*c* may comprise voice sample associated with the user captured during the conversation/dialog (e.g., captured via a microphone device sensor of the user device 104, the resource processing device(s) 120, and/or the system 106), the fourth input parameter 305*d* may comprise actual time zone associated with the user (e.g., captured via a timer/clock device sensor of the user device 104, the resource processing device(s) 120, and/or the system 106), a fifth input parameter 305*e* (not illustrated) may comprise an internet protocol (IP) parameter associated with the user device 104 (e.g., captured via an internet protocol (IP) sensor of the user device 104, the resource processing device(s) 120, and/or the system 106), a sixth input parameter 305*f* (not illustrated) may comprise authentication credentials provided by the user during the conversation/dialog, . . . , and/or, the $N^{th}$ input parameter 305*n* may comprise speech to text transformation of the voice sample (e.g., captured and/or constructed via an audio processing and transformation sensor of the system 106).

In embodiments where the request to execute the first activity via the first activity channel is associated with an audio communication channel, the plurality of input parameters may comprise a location parameter, a voice state parameter, an audio capture file, and a time parameter. In embodiments where, the request to execute the first activity via the first activity channel is associated with a non-audio communication channel, the plurality of input parameters associated with the first activity may comprise a location parameter, an internet protocol (IP) parameter, and a time parameter.

The network security system 106 (also referred to as the system 106 or "the system"), via the network security application environment 144, typically processes the activity data, in parallel, by controlling a neuron cluster component 350, as indicated by block 422. This neuron cluster bandwidth availability based input mapping, process channeling, and parallel neural network processing, via the network environment, may be substantially similar to that described with respect to FIG. 3 previously. Subsequently, as alluded to previously, at block 424, the system may construct an authentication level parameter associated with the parameter outputs for the first activity, thereby generating a first level of validation, i.e., credential based validation.

For the second level of validation, i.e., accuracy based validation, the system may transform the user inputs into a textual format, as indicated by block 426. Here, the voice based user input may be transformed to textual form, e.g., into letters/characters, words, phrases, sentences, etc. The system may transform the entire captured conversation into a text form. Alternatively, in some embodiments, to provide enhanced improvements to processing and memory utilization, the system may listen for/identify activity data parameters (e.g., resource identifiers, resource transfer values, etc.) within the conversation and only selectively transform portions of the conversation/dialog in response to determining that the portions are (i) associated with inputs provided by first user 102 and that (ii) the portions contain the activity data parameters. As such the system may transform the inputs provided by the first user 102 to a textual form. Based on comparing the transformed user inputs and the activity performance parameters generated by the second user 103, the system may construct a data matching parameter associated with the activity performance parameters, at block 428. The data matching parameter reflects how accurately the second user 103 generated the activity performance parameters. In other words, the data matching parameter reflects how accurate the activity performance parameters are, with respect to the inputs provided by the first user 102. The system may then determine whether (i) the authentication level parameter is above the predetermined authentication threshold, and (ii) the data matching parameter is above a predetermined evaluation threshold, as indicated by block 430. Subsequently, at block 432, the system may process the first activity in response to (i) determining that the authentication level parameter associated with the first activity is above the predetermined authentication threshold, and (ii) determining that the data matching parameter is above a predetermined evaluation threshold.

In some embodiments, the system may prevent check-out, dissuade viewing/access of personal information, lock the display screen of the device or otherwise suspend certain functionality associated with the merchant application and/or the mobile device, at least until the security proceed signal is determined, until the requirement of escalated authentication based on situational instance is ascertained and/or authentication credentials associated with escalated levels of authentication are validated. In this regard, the system may be overarching and may be configured to control one or more applications, operating system, user interface and other functionality associated with the user mobile device, based on receiving prior authorization from the user.

Typically, the user authentication is associated with multiple, predetermined levels of authentication, based on the functions that are permitted for the given authentication level. For example, a lowest level of authentication may be satisfactory to execute certain functions/activities like opening an application, viewing predetermined content and the like. A higher level of authentication may be required for other functions like modifying content, performing purchases. Typically, the level of authentication may be associated with one or more types of authentication credentials. For example, a low level of authentication may be associated with authentication credential types like a passcode, a swipe gesture, or no requirement for credentials at all. A moderate level of authentication may be associated with authentication credentials types like a username accompanied by an alphanumeric password, an account identifier along with an expiration date and the like. A high level of authentication may be associated with authentication credential types like biometric information (fingerprint scans, iris scans/facial recognition, voice recognition and the like), username accompanied by a one-time passcode generated/provided on another linked user device and the like. In some embodiments, the authentication level may be escalated using a combination of the authentication credential types. For example, the authentication level of a username-passcode authentication may be increased to a higher level with the user providing additional out of wallet credentials like predefined security questions, user contact information, identification information and the like. There may be multiple levels of authentication (3, 10, 15, or the like), with each level being associated with a numeric, alphabetic, visual or another suitable identifier.

The system ascertains the escalated authentication level based on at least the attributes associated with the historical exposure events determined to have similar situational instances as the user activity. The attributes of the exposure events determined to have similar situational attributes may comprise the number events, frequency of occurrence of events, significance of the event (type of exposure, type of data involved, amount of funds involved and the like), times of occurrence and other similar attributes. For example, a user activity may be associated with an authentication level A. Based on determining that the user activity is associated with a network determined to have a predetermined large number exposure events frequently, the system may escalate the required authentication to a higher level C. Alternately, based on determining that the user activity is associated with a network determined to have only one such exposure event and determined to have occurred before a predetermined time period (for example, a year), the system may escalate the required authentication to a higher level B. In this regard, the authentication level C may be higher than the authentication level B. In some embodiments, the system may require the escalated level of authentication only as long as the user activity is associated with the situational instance determined to be similar to historical exposure events, so that the user is not subjected to undue delays or inconvenience when not deemed necessary.

As discussed previously, as a part of the escalation of the authentication level, the system stops the first activity from being executed, i.e., prevents the activity associated with the first resource from being performed via the first activity channel. Here, escalation of the required authentication involves escalating the level of authentication required for the foregoing activity request above/beyond/higher than the level of authentication of the authentication credentials provided along with or for the activity request. For instance, the first activity request may be associated with a medium level of authentication involving a username-password pair based authentication. Continuing with this example, the system may escalate the required authentication to a higher level of authentication involving requiring a separate additional authentication response from the authorized user via another separate network device/communication channel (e.g., one that was previously authorized). The system may also present the required escalated authentication requirement to the user on the separate network device/communication channel, and trigger presentation of a request for the separate additional authentication response to the user.

FIG. 5 depicts a schematic high-level process flow 500 for neuron cluster bandwidth availability based input mapping, process channeling, and parallel neural network processing, in accordance with one embodiment of the present invention. The functions and features described herein may be performed, at least in part, by the network security system 106 via the network security application 144, in some embodiments.

Typically, as discussed previously, the network security system 106 (also referred to as the system 106 or "the system"), via the network security application environment 144, typically processes the activity data by controlling a neuron cluster component 350. In this regard, as indicated by block 502, the system performs task-based input mapping of the plurality of input parameters 310 associated with the first activity (e.g., via the task-based input mapping component 320), as described previously with respect to FIG. 3. Here, data associated with the plurality of input parameters 310 is analyzed. Moreover, for each input parameter of the plurality of input parameters 310, an associated processing task type is determined. Subsequently, each input parameter of the plurality of input parameters 310 is mapped to the associated processing task type (e.g., as indicated by input mapping elements 315*a*-315*n* of FIG. 3).

As a non-limiting example, for the first input parameter 305*a* of the current geographic location parameter type, input mapping A 315*a* may comprise comparison of captured current geographic location parameter type with previously validated original geo location parameters (e.g., associated with a location data comparison task type). Similarly, for the second input parameter 305*b* of the voice state parameter type, input mapping B 315*b* may comprise identification of presence of emotion indicators (e.g., a fear component value being above a certain threshold) and/or determination of value of the emotion indicators (e.g., a word speed/frequency value) in the captured voice sample (e.g., associated with voice state indicator determination task type), as a non-limiting example. As another non-limiting example, for the third input parameter 305*c* of the voice sample type, input mapping C 315*c* may comprise matching of user voice in the captured voice sample during the conversation/dialog with previously validated voice sample of the user (e.g., associated with a voice data comparison task type). As another non-limiting example, for the fourth input parameter 305*d* of the actual time zone type, input mapping D 315*d* may comprise comparison of the captured time zone during the conversation/dialog with previously validated time zones associated with the user (e.g., associated with a time data comparison task type). As another non-limiting example, for the fifth input parameter 305*e* (not illustrated) of the internet protocol (IP) parameter type, input mapping E 315*e* (not illustrated) may comprise comparison of the captured IP parameter during the conversation/dialog with previously validated IP parameters associated with the user (e.g., associated with a network data comparison task type). As yet another non-limiting example, for the sixth input parameter 305*f* (not illustrated) of the authentication credential type, input mapping F 315*f* (not illustrated) may comprise comparison of the authentication credentials (e.g., answers to security questions) provided by the user 102 with previously validated credentials associated with the user (e.g., associated with a credential validation task type). As yet another non-limiting example, for the $N^{th}$ input parameter 305*n* of the speech to text transformation type, input mapping N 315*n* may comprise determining parameters transaction accuracy of the activity data and entity inputs generated by the second user 103 in comparison with the inputs provided by the user 102 (e.g., associated with a parameter accuracy task type).

Typically, the neuron cluster component 350 comprises a plurality of neuron clusters 340 associated with a plurality of neuron layers 352 (e.g., input layers 352*a*, hidden layers 352*k*, output layers 352*n*. and/or the like). The system determines bandwidth availability of the plurality of neuron clusters 340 of the neuron cluster component 350 (e.g., via the input neuron bandwidth availability and task assignment hub component 330). Next, at block 504, the system triggers a first neuron cluster 342*a* of the plurality of neuron clusters 340 for processing a first input parameter (e.g., input parameter 305*a*, etc.) of the plurality of input parameters 310 (e.g., via the optimizer component 335), in response to determining that (i) the bandwidth availability of the first neuron cluster 342*a* is above a predetermined threshold and (ii) the first neuron cluster 342*a* matches the task-based input mapping associated with the first input parameter (e.g., input parameter 305*a*, etc.). As illustrated, the first neuron cluster 342*a* is associated with a first neuron layer (e.g., input layer(s) 352*a*).

Next, at block 506, the system causes/controls the first neuron cluster 342*a* to perform a first processing function on the first input parameter (e.g., input parameter 305*a*, etc.) of the plurality of input parameters 310. This is performed in parallel with performing a second processing function on a second input parameter (e.g., input parameter 305*b*, etc.) of the plurality of input parameters 310 via a second neuron cluster 342*b* of the plurality of neuron clusters 340.

Subsequently, at block 508, in response to the first processing function on the first input parameter (e.g., input parameter 305*a*, etc.) of the plurality of input parameters 310 via the first neuron cluster 342*a*, the system may trigger a third neuron cluster 342*k* of the plurality of neuron clusters 340 for performing a third processing function on the first input parameter (e.g., input parameter 305*a*, etc.) of the plurality of input parameters 310 (e.g., via the optimizer component 335). Here, as illustrated, the third neuron cluster 342*k* is associated with a second neuron layer (e.g., hidden layer(s) 352*k*) that is downstream from the first neuron layer (e.g., input layer(s) 352*a*) associated with the first neuron cluster 342*a*.

Moreover, at block 510, the system may link, via a synchronous recall unit 370 and the output tagging component 365, parameter outputs of the plurality of processing outputs associated with the first activity from the neuron cluster component 350. Here, a plurality of processing outputs from the neuron cluster component 350 are detected. Next, parameter outputs of the plurality of processing outputs associated with the plurality of input parameters 310 of the first activity are ascertained. Subsequently, each of the parameter outputs of the plurality of processing outputs are tagged with an identifier associated with the first activity.

Subsequently, at block 512, the neuron cluster component constructs an authentication level parameter associated with the parameter outputs for the first activity. The authentication level parameter indicates whether the captured input parameters 310 match an authentication level required for validating the security of the first activity. In some embodiments, the authentication level parameter takes the form of an authentication evaluation score associated with predetermined authentication threshold, above which the authentication evaluation score is compatible for validating the security of the first activity, and below which the authentication evaluation score is not compatible for validating the security of the first activity.

As will be appreciated by one of skill in the art, the present invention may be embodied as a method (including, for example, a computer-implemented process, a business process, and/or any other process), apparatus (including, for example, a system, machine, device, computer program product, and/or the like), or a combination of the foregoing. Accordingly, embodiments of the present invention may take the form of an entirely hardware embodiment, an entirely software embodiment (including firmware, resident software, micro-code, and the like), or an embodiment combining software and hardware aspects that may generally be referred to herein as a "system." Furthermore, embodiments of the present invention may take the form of a computer program product on a computer-readable medium having computer-executable program code embodied in the medium.

Any suitable transitory or non-transitory computer readable medium may be utilized. The computer readable medium may be, for example but not limited to, an electronic, magnetic, optical, electromagnetic, infrared, or semiconductor system, apparatus, or device. More specific examples of the computer readable medium include, but are not limited to, the following: an electrical connection having one or more wires; a tangible storage medium such as a portable computer diskette, a hard disk, a random access memory (RAM), a read-only memory (ROM), an erasable programmable read-only memory (EPROM or Flash memory), a compact disc read-only memory (CD-ROM), or other optical or magnetic storage device.

In the context of this document, a computer readable medium may be any medium that can contain, store, communicate, or transport the program for use by or in connection with the instruction execution system, apparatus, or device. The computer usable program code may be transmitted using any appropriate medium, including but not limited to the Internet, wireline, optical fiber cable, radio frequency (RF) signals, or other mediums.

Computer-executable program code for carrying out operations of embodiments of the present invention may be written in an object oriented, scripted or unscripted programming language. However, the computer program code for carrying out operations of embodiments of the present invention may also be written in conventional procedural programming languages, such as the "C" programming language or similar programming languages.

Embodiments of the present invention are described above with reference to flowchart illustrations and/or block diagrams of methods, apparatus (systems), and computer program products. It will be understood that each block of the flowchart illustrations and/or block diagrams, and/or combinations of blocks in the flowchart illustrations and/or block diagrams, can be implemented by computer-executable program code portions. These computer-executable program code portions may be provided to a processor of a general purpose computer, special purpose computer, or other programmable data processing apparatus to produce a particular machine, such that the code portions, which execute via the processor of the computer or other programmable data processing apparatus, create mechanisms for implementing the functions/acts specified in the flowchart and/or block diagram block or blocks.

These computer-executable program code portions may also be stored in a computer-readable memory that can direct a computer or other programmable data processing apparatus to function in a particular manner, such that the code portions stored in the computer readable memory produce an article of manufacture including instruction mechanisms which implement the function/act specified in the flowchart and/or block diagram block(s).

The computer-executable program code may also be loaded onto a computer or other programmable data processing apparatus to cause a series of operational steps to be performed on the computer or other programmable apparatus to produce a computer-implemented process such that the code portions which execute on the computer or other programmable apparatus provide steps for implementing the functions/acts specified in the flowchart and/or block diagram block(s). Alternatively, computer program implemented steps or acts may be combined with operator or human implemented steps or acts in order to carry out an embodiment of the invention.

As the phrase is used herein, a processor may be "configured to" perform a certain function in a variety of ways, including, for example, by having one or more general-purpose circuits perform the function by executing particular computer-executable program code embodied in computer-readable medium, and/or by having one or more application-specific circuits perform the function.

Embodiments of the present invention are described above with reference to flowcharts and/or block diagrams. It will be understood that steps of the processes described herein may be performed in orders different than those illustrated in the flowcharts. In other words, the processes represented by the blocks of a flowchart may, in some embodiments, be in performed in an order other that the order illustrated, may be combined or divided, or may be performed simultaneously. It will also be understood that the blocks of the block diagrams illustrated, in some embodiments, merely conceptual delineations between systems and one or more of the systems illustrated by a block in the block diagrams may be combined or share hardware and/or software with another one or more of the systems illustrated by a block in the block diagrams. Likewise, a device, system, apparatus, and/or the like may be made up of one or more devices, systems, apparatuses, and/or the like. For example, where a processor is illustrated or described herein, the processor may be made up of a plurality of microprocessors or other processing devices which may or may not be coupled to one another. Likewise, where a memory is illustrated or described herein, the memory may be made up of a plurality of memory devices which may or may not be coupled to one another.

While certain exemplary embodiments have been described and shown in the accompanying drawings, it is to be understood that such embodiments are merely illustrative of, and not restrictive on, the broad invention, and that this invention not be limited to the specific constructions and arrangements shown and described, since various other changes, combinations, omissions, modifications and substitutions, in addition to those set forth in the above paragraphs, are possible. Those skilled in the art will appreciate that various adaptations and modifications of the just described embodiments can be configured without departing from the scope and spirit of the invention. Therefore, it is to be understood that, within the scope of the appended claims, the invention may be practiced other than as specifically described herein.

What is claimed is:

1. A system for dynamic authentication and processing of electronic activities based on parallel neural network processing, wherein the system is structured for neuron cluster bandwidth availability based input mapping and process channeling for dynamic detection of security events associated with network devices and resources and triggering real-time mitigation operations, the system comprising:

at least one memory device;

at least one communication device connected to a distributed network;

at least one processing device operatively coupled to the at least one memory device; and a module stored in the at least one memory device comprising executable instructions that when executed by the at least one processing device, cause the at least one processing device to:

receive, from a first network device, via a conversation between a first user and a second user, a request from the first user to execute a first activity via a first activity channel, wherein the first activity is associated with a first resource, wherein the conversation between the first user and the second user comprises first user inputs provided by the first user interspersed with entity responses provided by the second user;

extract activity data regarding the first network device and the first resource, wherein extracting the activity data comprises:

capturing, via one or more sensor devices, a plurality of input parameters associated with the first activity, wherein the plurality of input parameters associated with the first activity comprise an audio capture file associated with the conversation between the first user and the second user;

identifying portions of the audio capture file comprising activity performance parameters; and selectively transforming into a textual format, audio data of only the portions of the audio capture file (i) comprising the activity performance parameters, and (ii) that are provided by the user as the first user inputs;

construct a data matching parameter associated with the activity performance parameters based on comparing the selectively transformed portions of the audio capture file with generated activity performance parameters constructed by the second user;

process, in parallel, the activity data via a neuron cluster component, wherein the neuron cluster component comprises a plurality of neuron clusters associated with a plurality of neuron layers, wherein processing, in parallel, the activity data comprises:

performing task-based input mapping of the plurality of input parameters associated with the first activity;

determining bandwidth availability of the plurality of neuron clusters of the neuron cluster component, wherein the bandwidth availability is associated with processing capacity of each of the plurality of neuron clusters;

triggering a first neuron cluster of the plurality of neuron clusters for processing a first input parameter of the plurality of input parameters, in response to determining that both (i) the bandwidth availability of the first neuron cluster is above a predetermined threshold and (ii) the first neuron cluster matches the task-based input mapping associated with the first input parameter such that the first neuron cluster is compatible with at least a portion of a first processing function, wherein the first neuron cluster is associated with a first neuron layer; and performing, via the first neuron cluster, the first processing function on the first input parameter of the plurality of input parameters, in parallel with performing a second processing function on a second input parameter of the plurality of input parameters via a second neuron cluster of the plurality of neuron clusters;

processing, in parallel with the plurality of input parameters associated with the first activity, via the neuron clusters, additional input parameters associated with additional discrete activities that are separate from the first activity; and generating, via the plurality of neuron clusters, a plurality of disjointed processing outputs comprising parameter outputs associated with the first activity and additional outputs associated with the additional discrete activities, wherein the plurality of disjointed processing outputs generated by the plurality of neuron clusters are disjointed such that parameter outputs associated with the first activity are out of sequence;

link, via a synchronous recall unit, the parameter outputs, of the plurality of disjointed processing outputs generated by the neuron cluster component, that are associated with the first activity;

construct an authentication level parameter associated with the parameter outputs for the first activity; and process the first activity based on at least (i) determining that the authentication level parameter associated with the first activity is above a predetermined authentication threshold, and (ii) determining that the data matching parameter is above a predetermined evaluation threshold.

2. The system of claim 1, wherein performing task-based input mapping of the plurality of input parameters associated with the first activity further comprises:

analyzing data associated with the plurality of input parameters;

determining, for each input parameter of the plurality of input parameters, an associated processing task type such that the processing task type is compatible with the input parameter, comprising:

comparing the input parameter with a compatible validated credential parameter;

determining whether the input parameter is within a threshold range of the compatible validated credential parameter; and verifying absence or presence of predetermined indicators in the input parameter; and mapping each input parameter of the plurality of input parameters to the associated processing task type.

3. The system of claim 1, wherein processing, in parallel, the activity data comprises further comprises:

trigger the second neuron cluster of the plurality of neuron clusters for processing the second input parameter of the plurality of input parameters, in response to determining that (i) the bandwidth availability of the second neuron cluster is above a predetermined threshold and (ii) the second neuron cluster matches the task-based input mapping associated with the second input parameter, wherein the second neuron cluster is associated with a first neuron layer.

4. The system of claim 1, wherein processing, in parallel, the activity data comprises further comprises:

in response to the first processing function on the first input parameter of the plurality of input parameters via the first neuron cluster, trigger a third neuron cluster of the plurality of neuron clusters for performing a third processing function on the first input parameter of the plurality of input parameters based on at least determining that the bandwidth availability of the third neuron cluster is above the predetermined threshold, wherein the third neuron cluster is associated with a second neuron layer that is downstream from the first neuron layer associated with the first neuron cluster.

5. The system of claim 4, wherein during triggering of the first neuron cluster of the plurality of neuron clusters for processing the first input parameter of the plurality of input parameters, (i) the third neuron cluster of the plurality of neuron clusters is associated with performing the third processing function on a third input parameter associated with a second activity associated with a second resource, and (ii) the bandwidth availability of the third neuron cluster is not above the predetermined threshold.

6. The system of claim 1, wherein linking, via the synchronous recall unit, parameter outputs of the plurality of processing outputs further comprises:

detecting the plurality of disjointed processing outputs from the neuron cluster component;

and tagging each of the parameter outputs of the plurality of disjointed processing outputs with an identifier associated with the first activity.

7. The system of claim 1, wherein the executable instructions when executed by the at least one processing device further cause the at least one processing device to map each of the plurality of input parameters to an associated task type, comprising:

comparing a first input parameter of the plurality of input parameters associated with a geographic location parameter with previously validated geolocation parameters;

identifying predetermined emotion indicators within a second input parameter of the plurality of input parameters associated with a voice state parameter;

matching a third input parameter of the plurality of input parameters associated with a voice sample parameter with previously validated voice samples;

comparing a fourth input parameter of the plurality of input parameters associated with a time zone parameter with previously validated time zones associated with the first user;

comparing a fifth input parameter of the plurality of input parameters associated with a internet protocol parameter with previously validated internet protocol parameters associated with the first user; and comparing a sixth input parameter of the plurality of input parameters associated with a user input authentication credential with previously validated credentials associated with the first user.

8. The system of claim 1, wherein the request to execute the first activity via the first activity channel is associated with an audio communication channel, wherein the plurality of input parameters associated with the first activity comprise a location parameter, a voice state parameter, an audio capture file, and a time parameter.

9. The system of claim 1, wherein the request to execute the first activity via the first activity channel is associated with a non-audio communication channel, wherein the plurality of input parameters associated with the first activity comprise a location parameter, an internet protocol (IP) parameter, and a time parameter.

10. The system of claim 1, wherein the plurality of neuron layers comprise one or more input layers, one or more hidden layers and one or more output layers.

11. The system of claim 1, wherein the executable instructions when executed by the at least one processing device further cause the at least one processing device to:

escalate, in real-time, a required level of authentication for the first activity from an existing level to a higher level, wherein successful authentication at the higher level requires additional authentication credentials;

trigger, in real-time, initiation of the one or more tiered adaptive mitigation actions, prior processing of the first activity via the first activity channel to prevent security exposure associated with the first activity, in response to determining that the authentication level parameter associated with the first activity is not above the predetermined authentication threshold;

block processing of the first activity via the first activity channel;

lock a display screen associated the first network device and prevent viewing of personal information via the first network device; and in response to determining a security proceed signal, process the first activity via the first activity channel.

12. The system of claim 11, wherein initiating the one or more tiered adaptive mitigation actions further comprises:

implementing a partial block of the first resource such that the first activity associated with the first resource is blocked;

determining one or more second resources associated with the first resource; and implementing a block on the one or more second resources such that execution of one or more second activities associated with the one or more second resources is prevented.

13. A computer program product for dynamic authentication and processing of electronic activities based on parallel neural network processing, whereby the computer program product is structured for neuron cluster bandwidth availability based input mapping and process channeling for dynamic detection of security events associated with network devices and resources and triggering real-time mitigation operations, the computer program product comprising a non-transitory computer-readable storage medium having computer-executable instructions to:

receive, from a first network device, via a conversation between a first user and a second user, a request from the first user to execute a first activity via a first activity channel, wherein the first activity is associated with a first resource, wherein the conversation between the first user and the second user comprises first user inputs provided by the first user interspersed with entity responses provided by the second user;

extract activity data regarding the first network device and the first resource, wherein extracting the activity data comprises:

capturing, via one or more sensor devices, a plurality of input parameters associated with the first activity, wherein the plurality of input parameters associated with the first activity comprise an audio capture file associated with the conversation between the first user and the second user;

identifying portions of the audio capture file comprising activity performance parameters; and selectively transforming into a textual format, audio data of only the portions of the audio capture file (i) comprising the activity performance parameters, and (ii) that are provided by the user as the first user inputs;

construct a data matching parameter associated with the activity performance parameters based on comparing the selectively transformed portions of the audio capture file with generated activity performance parameters constructed by the second user;

process, in parallel, the activity data via a neuron cluster component, wherein the neuron cluster component comprises a plurality of neuron clusters associated with a plurality of neuron layers, wherein processing, in parallel, the activity data comprises:

performing task-based input mapping of the plurality of input parameters associated with the first activity;

determining bandwidth availability of the plurality of neuron clusters of the neuron cluster component, wherein the bandwidth availability is associated with processing capacity of each of the plurality of neuron clusters;

triggering a first neuron cluster of the plurality of neuron clusters for processing a first input parameter of the plurality of input parameters, in response to determining that both (i) the bandwidth availability of the first neuron cluster is above a predetermined threshold and (ii) the first neuron cluster matches the task-based input mapping associated with the first input parameter such that the first neuron cluster is compatible with at least a portion of a first processing function, wherein the first neuron cluster is associated with a first neuron layer; and performing, via the first neuron cluster, a first processing function on the first input parameter of the plurality of input parameters, in parallel with performing a second processing function on a second input parameter of the plurality of input parameters via a second neuron cluster of the plurality of neuron clusters;

processing, in parallel with the plurality of input parameters associated with the first activity, via the neuron clusters, additional input parameters associated with additional discrete activities that are separate from the first activity; and generating, via the plurality of neuron clusters, a plurality of disjointed processing outputs comprising parameter outputs associated with the first activity and additional outputs associated with the additional discrete activities, wherein the plurality of disjointed processing outputs generated by the plurality of neuron clusters are disjointed such that parameter outputs associated with the first activity are out of sequence;

link, via a synchronous recall unit, the parameter outputs, of the plurality of disjointed processing outputs generated by the neuron cluster component, that are associated with the first activity;

construct an authentication level parameter associated with the parameter outputs for the first activity; and process the first activity based on at least (i) determining that the authentication level parameter associated with the first activity is above a predetermined authentication threshold, and (ii) determining that the data matching parameter is above a predetermined evaluation threshold.

14. The computer program product of claim 13, wherein performing task-based input mapping of the plurality of input parameters associated with the first activity further comprises:

analyzing data associated with the plurality of input parameters;

determining, for each input parameter of the plurality of input parameters, an associated processing task type such that the processing task type is compatible with the input parameter, comprising:

comparing the input parameter with a compatible validated credential parameter;

determining whether the input parameter is within a threshold range of the compatible validated credential parameter; and verifying absence or presence of predetermined indicators in the input parameter; and mapping each input parameter of the plurality of input parameters to the associated processing task type.

15. The computer program product of claim 13, wherein processing, in parallel, the activity data comprises further comprises:

trigger the second neuron cluster of the plurality of neuron clusters for processing the second input parameter of the plurality of input parameters, in response to determining that (i) the bandwidth availability of the second neuron cluster is above a predetermined threshold and (ii) the second neuron cluster matches the task-based input mapping associated with the second input parameter, wherein the second neuron cluster is associated with a first neuron layer.

16. The computer program product of claim 13, wherein linking, via the synchronous recall unit, parameter outputs of the plurality of processing outputs further comprises:

detecting the plurality of disjointed processing outputs from the neuron cluster component;

and tagging each of the parameter outputs of the plurality of disjointed processing outputs with an identifier associated with the first activity.

17. A method for dynamic authentication and processing of electronic activities based on parallel neural network processing, whereby the method is structured for neuron cluster bandwidth availability based input mapping and process channeling for dynamic detection of security events associated with network devices and resources and triggering real-time mitigation operations, the method comprising:

receiving, from a first network device, via a conversation between a first user and a second user, a request from the first user to execute a first activity via a first activity channel, wherein the first activity is associated with a first resource, wherein the conversation between the first user and the second user comprises first user inputs provided by the first user interspersed with entity responses provided by the second user;

extracting activity data regarding the first network device and the first resource, wherein extracting the activity data comprises:

capturing, via one or more sensor devices, a plurality of input parameters associated with the first activity, wherein the plurality of input parameters associated with the first activity comprise an audio capture file associated with the conversation between the first user and the second user;

identifying portions of the audio capture file comprising activity performance parameters; and selectively transforming into a textual format, audio data of only the portions of the audio capture file (i) comprising the activity performance parameters, and (ii) that are provided by the user as the first user inputs;

constructing a data matching parameter associated with the activity performance parameters based on comparing the selectively transformed portions of the audio capture file with generated activity performance parameters constructed by the second user;

processing, in parallel, the activity data via a neuron cluster component, wherein the neuron cluster component comprises a plurality of neuron clusters associated with a plurality of neuron layers, wherein processing, in parallel, the activity data comprises:

performing task-based input mapping of the plurality of input parameters associated with the first activity;

determining bandwidth availability of the plurality of neuron clusters of the neuron cluster component, wherein the bandwidth availability is associated with processing capacity of each of the plurality of neuron clusters;

triggering a first neuron cluster of the plurality of neuron clusters for processing a first input parameter of the plurality of input parameters, in response to determining that both (i) the bandwidth availability of the first neuron cluster is above a predetermined threshold and (ii) the first neuron cluster matches the task-based input mapping associated with the first input parameter such that the first neuron cluster is compatible with at least a portion of a first processing function, wherein the first neuron cluster is associated with a first neuron layer; and performing, via the first neuron cluster, a first processing function on the first input parameter of the plurality of input parameters, in parallel with performing a second processing function on a second input parameter of the plurality of input parameters via a second neuron cluster of the plurality of neuron clusters;

processing, in parallel with the plurality of input parameters associated with the first activity, via the neuron clusters, additional input parameters associated with additional discrete activities that are separate from the first activity; and generating, via the plurality of neuron clusters, a plurality of disjointed processing outputs comprising parameter outputs associated with the first activity and additional outputs associated with the additional discrete activities, wherein the plurality of disjointed processing outputs generated by the plurality of neuron clusters are disjointed such that parameter outputs associated with the first activity are out of sequence;

linking, via a synchronous recall unit, the parameter outputs, of the plurality of disjointed processing outputs generated by the neuron cluster component, that are associated with the first activity;

constructing an authentication level parameter associated with the parameter outputs for the first activity; and processing the first activity based on at least (i) determining that the authentication level parameter associated with the first activity is above a predetermined authentication threshold, and (ii) determining that the data matching parameter is above a predetermined evaluation threshold.

18. The method of claim 17, wherein performing task-based input mapping of the plurality of input parameters associated with the first activity further comprises:

analyzing data associated with the plurality of input parameters;

determining, for each input parameter of the plurality of input parameters, an associated processing task type such that the processing task type is compatible with the input parameter, comprising:

comparing the input parameter with a compatible validated credential parameter;

determining whether the input parameter is within a threshold range of the compatible validated credential parameter; and verifying absence or presence of predetermined indicators in the input parameter; and mapping each input parameter of the plurality of input parameters to the associated processing task type.

19. The method of claim 17, wherein processing, in parallel, the activity data comprises further comprises:

trigger the second neuron cluster of the plurality of neuron clusters for processing the second input parameter of the plurality of input parameters, in response to determining that (i) the bandwidth availability of the second neuron cluster is above a predetermined threshold and (ii) the second neuron cluster matches the task-based input mapping associated with the second input parameter, wherein the second neuron cluster is associated with a first neuron layer.

20. The method of claim 17, wherein linking, via the synchronous recall unit, parameter outputs of the plurality of processing outputs further comprises:

detecting the plurality of disjointed processing outputs from the neuron cluster component;

and tagging each of the parameter outputs of the plurality of disjointed processing outputs with an identifier associated with the first activity.

* * * * *